(12) United States Patent
Lee

(10) Patent No.: US 11,616,103 B2
(45) Date of Patent: Mar. 28, 2023

(54) ELECTRONIC DEVICE

(71) Applicant: Samsung Display Co., Ltd., Yongin-Si (KR)

(72) Inventor: Soongyu Lee, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/541,919

(22) Filed: Dec. 3, 2021

(65) Prior Publication Data

US 2022/0344409 A1    Oct. 27, 2022

(30) Foreign Application Priority Data

Apr. 26, 2021    (KR) .......................... 10-2021-0053682

(51) Int. Cl.
*H01L 27/32* (2006.01)
*G06F 3/044* (2006.01)
*G09G 3/3233* (2016.01)
*G06F 3/041* (2006.01)

(52) U.S. Cl.
CPC .......... *H01L 27/323* (2013.01); *G06F 3/0446* (2019.05); *G06F 3/04142* (2019.05); *G09G 3/3233* (2013.01); *H01L 27/3276* (2013.01); *G06F 2203/04108* (2013.01); *G09G 2310/0264* (2013.01); *G09G 2310/08* (2013.01)

(58) Field of Classification Search
CPC ......... H01L 27/323; H01L 27/32–3293; G06F 3/0412; G06F 3/041–047; G06F 2203/041–04114
See application file for complete search history.

(56) References Cited

U.S. PATENT DOCUMENTS 9,501,975 B2    11/2016  Eom et al.
2017/0269745 A1*  9/2017  Ding .................... G06F 3/0412
2021/0012717 A1   1/2021  Park et al.

FOREIGN PATENT DOCUMENTS

KR         10-1917757 B1     11/2018
KR      10-2021-0007455 A     1/2021

\* cited by examiner

*Primary Examiner* — Sanjiv D. Patel
(74) *Attorney, Agent, or Firm* — Innovation Counsel LLP

(57) ABSTRACT

An electronic device is disclosed that includes a display layer, a display driver, a sensor layer on the display layer, and a sensor driver that drives the sensor layer. The display layer includes a scan line, a data line, an emission control line. The display driver drives the display layer and provides signals to the scan, data, and emission control lines. The sensor layer operates in a first sensing mode driven at a first sensing frequency or in a second sensing mode driven at a second sensing frequency different from the first sensing frequency. When the sensor layer operates in the first sensing mode, the display driver outputs a first emission control signal to the emission control line. When the sensor layer operates in the second sensing mode, the display driver provides the emission control line with a second emission control signal having a second waveform that is different from a first waveform of the first emission control signal.

20 Claims, 19 Drawing Sheets

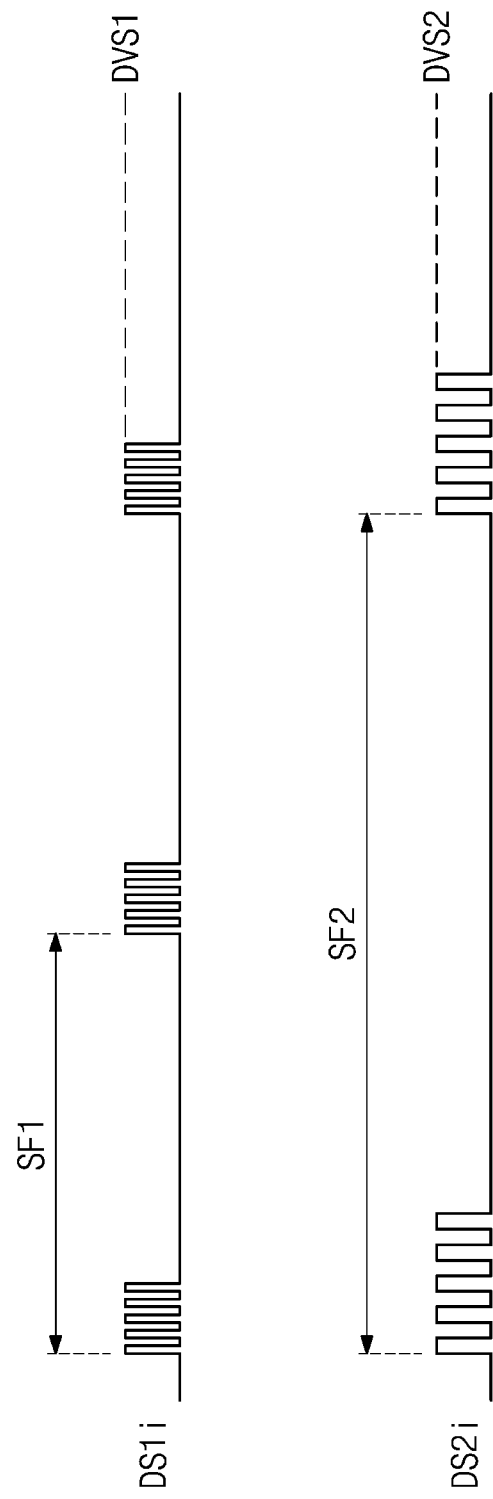

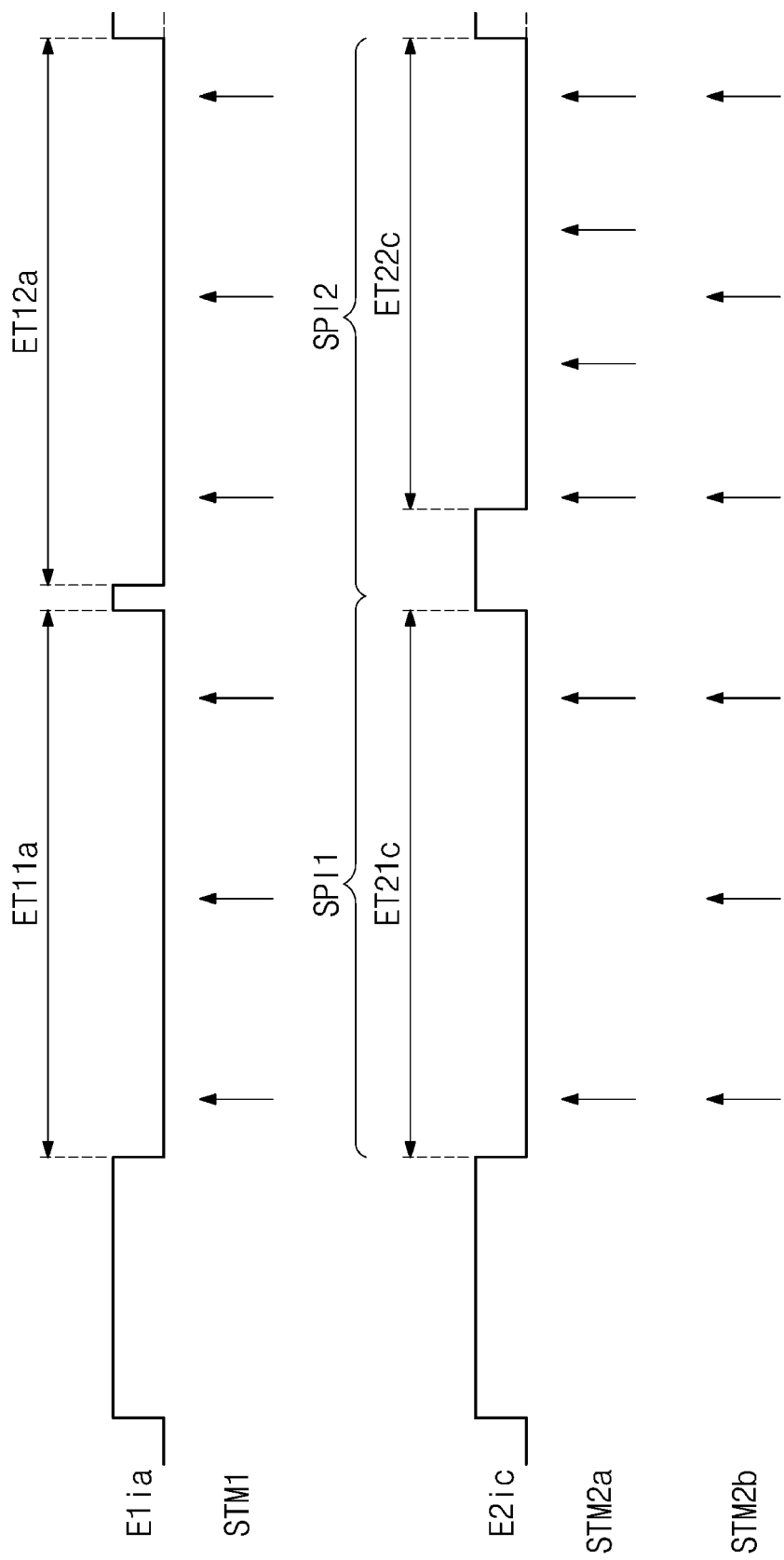

<Proximity Sensing Mode>

<Proximity Sensing Mode>

<Proximity Sensing Mode>

ELECTRONIC DEVICE

CROSS-REFERENCE TO RELATED APPLICATION

This U.S. nonprovisional application claims priority under 35 U. S. C. § 119 to Korean Patent Application No. 10-2021-0053682 filed on Apr. 26, 2021, in the Korean Intellectual Property Office, the disclosure of which is hereby incorporated by reference in its entirety.

BACKGROUND

The present inventive concept relates to an electronic device that has a proximity sensing function.

A display device for displaying images is included in multimedia electronic devices, such as televisions, mobile phones, tablet computers, navigations, and game consoles. The electronic device may include an input sensor that provides touch-based input methods other than typical input methods via button, keyboard, or mouse, in which touch-based input method a user intuitively and conveniently inputs information or command.

SUMMARY

According to an embodiment of the present inventive concept, an electronic device may comprise: a display layer comprising a scan line, a data line, an emission control line, and a pixel; a display driver configured to drive the display layer and provide corresponding signals to the scan line, the data line, and the emission control line; a sensor layer on the display layer, the sensor layer operating in a first sensing mode driven at a first sensing frequency or in a second sensing mode driven at a second sensing frequency different from the first sensing frequency; and a sensor driver configured to drive the sensor layer. When the sensor layer operates in the first sensing mode, the display driver may output a first emission control signal to the emission control line. When the sensor layer operates in the second sensing mode, the display driver may output a second emission control signal to the emission control line. The second emission control signal may have a second waveform different from a first waveform of the first emission control signal.

In an embodiment, the second sensing frequency may be less than the first sensing frequency. The second sensing mode may be a proximity sensing mode that detects an object spaced apart from a surface of the electronic device.

In an embodiment, a length of an interval in which the first emission control signal is activated may be less than a length of an interval in which the second emission control signal is activated.

In an embodiment, the pixel may include: a pixel circuit electrically connected to the scan line, the data line, and the emission control line; and a light emitting element electrically connected to the pixel circuit. A first driving current that flows through the light emitting element when the first emission control signal is provided may be greater than a second driving current that flows through the light emitting element when the second emission control signal is provided.

In an embodiment, during one frame interval in which an image is displayed on the display layer, the number of a plurality of first activation intervals in which the first emission control signal is activated may be greater than the number of a plurality of second activation intervals in which the second emission control signal is activated.

In an embodiment, a length of each of the first activation intervals may be less than a length of each of the second activation intervals.

In an embodiment, a length of an interval in which the first emission control signal is activated may be greater than a length of an interval in which the second emission control signal is activated.

In an embodiment, the pixel may include: a pixel circuit electrically connected to the scan line, the data line, and the emission control line; and a light emitting element electrically connected to the pixel circuit. A first driving current that flows through the light emitting element when the first emission control signal is provided may be less than a second driving current that flows through the light emitting element when the second emission control signal is provided.

In an embodiment, during one frame interval in which an image is displayed on the display layer, the number of a plurality of first activation intervals in which the first emission control signal is activated may be the same as the number of a plurality of second activation intervals in which the second emission control signal is activated.

In an embodiment, during one frame interval in which an image is displayed on the display layer, lengths of a plurality of first activation intervals in which the first emission control signal is activated may be the same as each other.

In an embodiment, during one frame interval in which an image is displayed on the display layer, a plurality of second activation intervals in which the second emission control signal is activated may include a first sub-activation interval and a second sub-activation interval that has a length less than a length of the first sub-activation interval.

In an embodiment, the sensor driver may receive sensing signals from the sensor layer. The sensor driver may sample and convert the sensing signals into digital data. The sensor driver may apply weights to ones of the sensing signals and coverts the ones of the sensing signals into digital data. The ones of the sensing signals may be sensed in an interval that includes the second sub-activation interval.

In an embodiment, the sensor driver may receive sensing signals from the sensor layer. The sensor driver may sample and convert the sensing signals into digital data. The number of times of sampling sensing signals sensed in an interval that includes the second sub-activation interval may be greater than the number of times of sampling sensing signals sensed in an interval that includes the first sub-activation interval.

In an embodiment, the display layer may include a first display region and a second display region adjacent to the first display region. The emission control line may include a first emission control line on the first display region and a second emission control line on the second display region. When the sensor layer operates in the first sensing mode, the display driver may output the first emission control signal to the first emission control line and may output an $(x+1)^{th}$ first emission control signal to the second emission control line. When the sensor layer operates in the second sensing mode, the display driver may output the second emission control signal to the first emission control line and may output an $(x+1)^{th}$ first emission control signal to the second emission control line.

According to an embodiment of the present inventive concept, an electronic device may comprise: a display layer comprising a scan line, a data line, an emission control line, and a pixel; a display driver configured to drive the display layer and provides corresponding signals to the scan line, the data line, and the emission control line; a sensor layer disposed on the display layer and detecting an external input; and a sensor driver configured to drive the sensor layer. When the sensor layer enters a proximity sensing mode from a touch sensing mode, the display driver may generate a second emission control signal obtained by changing a waveform of a first emission control signal that is output to the emission control line and may output the second emission control signal to the emission control line.

In an embodiment, in the touch sensing mode, the sensor layer may be driven at a first sensing frequency. In the proximity sensing mode, the sensor layer may be driven at a second sensing frequency less than the first sensing frequency.

In an embodiment, during one frame interval in which an image is displayed on the display layer, the number of a plurality of first activation intervals in which the first emission control signal is activated may be greater than the number of a plurality of second activation intervals in which the second emission control signal is activated. A length of each of the first activation intervals may be less than a length of each of the second activation intervals.

In an embodiment, during one frame interval in which an image is displayed on the display layer, the number of a plurality of first activation intervals in which the first emission control signal is activated may be the same as the number of a plurality of second activation intervals in which the second emission control signal is activated. During one frame interval in which an image is displayed on the display layer, lengths of the plurality of first activation intervals in which the first emission control signal is activated may be the same as each other. During one frame interval in which an image is displayed on the display layer, the plurality of second activation intervals in which the second emission control signal is activated may include a first sub-activation interval and a second sub-activation interval that has a length less than a length of the first sub-activation interval.

In an embodiment, the pixel may include: a pixel circuit electrically connected to the scan line, the data line, and the emission control line; and a light emitting element electrically connected to the pixel circuit. A first driving current that flows through the light emitting element when the first emission control signal is provided may be different from a second driving current that flows through the light emitting element when the second emission control signal is provided.

In an embodiment, the display layer may include a first display region and a second display region adjacent to the first display region. The emission control line may include a first emission control line on the first display region and a second emission control line on the second display region. When the sensor layer operates in the touch sensing mode, the display driver may output the first emission control signal to the first emission control line and may output an $(x+1)^{th}$ first emission control signal to the second emission control line. When the sensor layer operates in the proximity sensing mode, the display driver may output the second emission control signal to the first emission control line and may output an $(x+1)^{th}$ first emission control signal or an $(x+1)^{th}$ second emission control signal to the second emission control line.

BRIEF DESCRIPTION OF THE DRAWINGS

FIG. 7B illustrates timing diagrams of transmission signals provided to the sensor layer depicted in FIG. 7A.

FIG. 10B illustrates timing diagrams of a first emission control signal and a second emission control signal according to an embodiment of the present inventive concept.

DETAILED DESCRIPTION OF EMBODIMENTS

Figure 1:
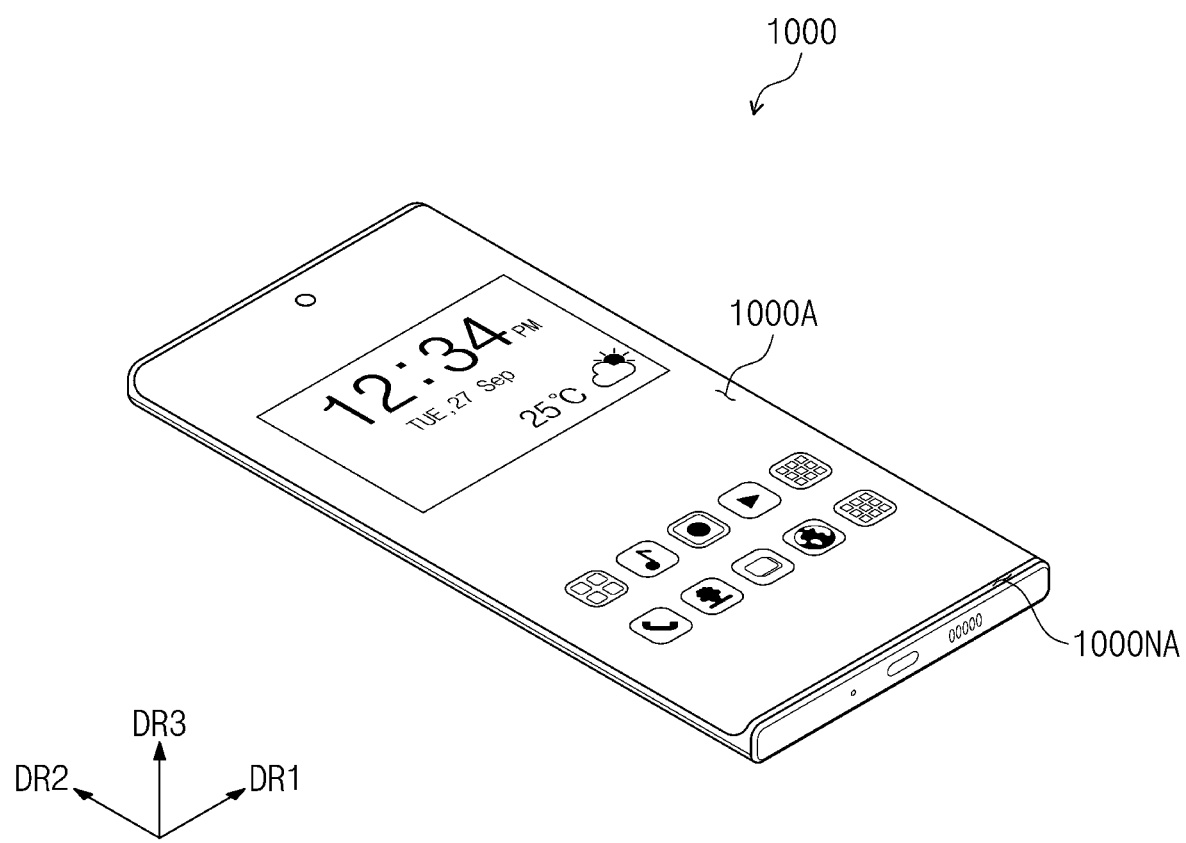
FIG. 1 illustrates a perspective view showing an electronic device according to an embodiment of the present inventive concept.

Some embodiments of the present inventive concept provide an electronic device that includes a sensor layer having a proximity sensing function.

In this description, when a certain component (or region, layer, portion, etc.) is referred to as being "on", "connected to", or "coupled to" other component(s), the certain component may be directly on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

It will be understood that, although the terms first, second, etc. may be used herein to describe various components, these components should not be limited by these terms. These terms are only used to distinguish one component from another component. For example, a first component could be termed a second component, and vice versa without departing from the scope of the present inventive concept. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have," and the like are used to specify the presence of stated features, integers, steps, operations, components, elements, or combinations thereof, but do not preclude the presence or addition of one or more other features, integers, steps, operations, components, elements, or combinations thereof.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

The term "part" or "unit" refers to a software component or a hardware component that performs a specific function. The hardware component may include, for example, a field-programmable gate array (FPGA) or an application-specific integrated circuit (ASIC). The software component may refer to executable code or data used by executable code in an addressable storage medium. Therefore, the software components may be, for example, object-oriented software components, class components, and task components, and may include processes, functions, attributes, procedures, subroutines, program code segments, drivers, firmware, micro-codes, circuits, data, database, data structures, tables, arrangements, or variables.

The following will now describe some embodiments of the present inventive concept in conjunction with the accompanying drawings.

FIG. 1 illustrates a perspective view showing an electronic device according to an embodiment of the present inventive concept.

Referring to FIG. 1, an electronic device 1000 may be an apparatus that is activated with an electronic signal. For example, the electronic device 1000 may be a mobile phone, a tablet computer, an automotive navigation system, a game console, or a wearable apparatus, but the present inventive concept is not limited thereto. FIG. 1 depicts by way of example a mobile phone as the electronic device 1000.

An active region 1000A and a peripheral region 1000NA may be defined on the electronic device 1000. The electronic device 1000 may display an image on the active region 1000A. The active region 1000A may include a plane defined by a first direction DR1 and a second direction DR2. The peripheral region 1000NA may surround the active region 1000A.

A thickness direction of the electronic device 1000 may be parallel to a third direction DR3 that intersects the first direction DR1 and the second direction DR2. The third direction DR3 may be used as a reference to define front and rear surfaces (or top and bottom surfaces) of each of members that constitute the electronic device 1000.

Figure 2:
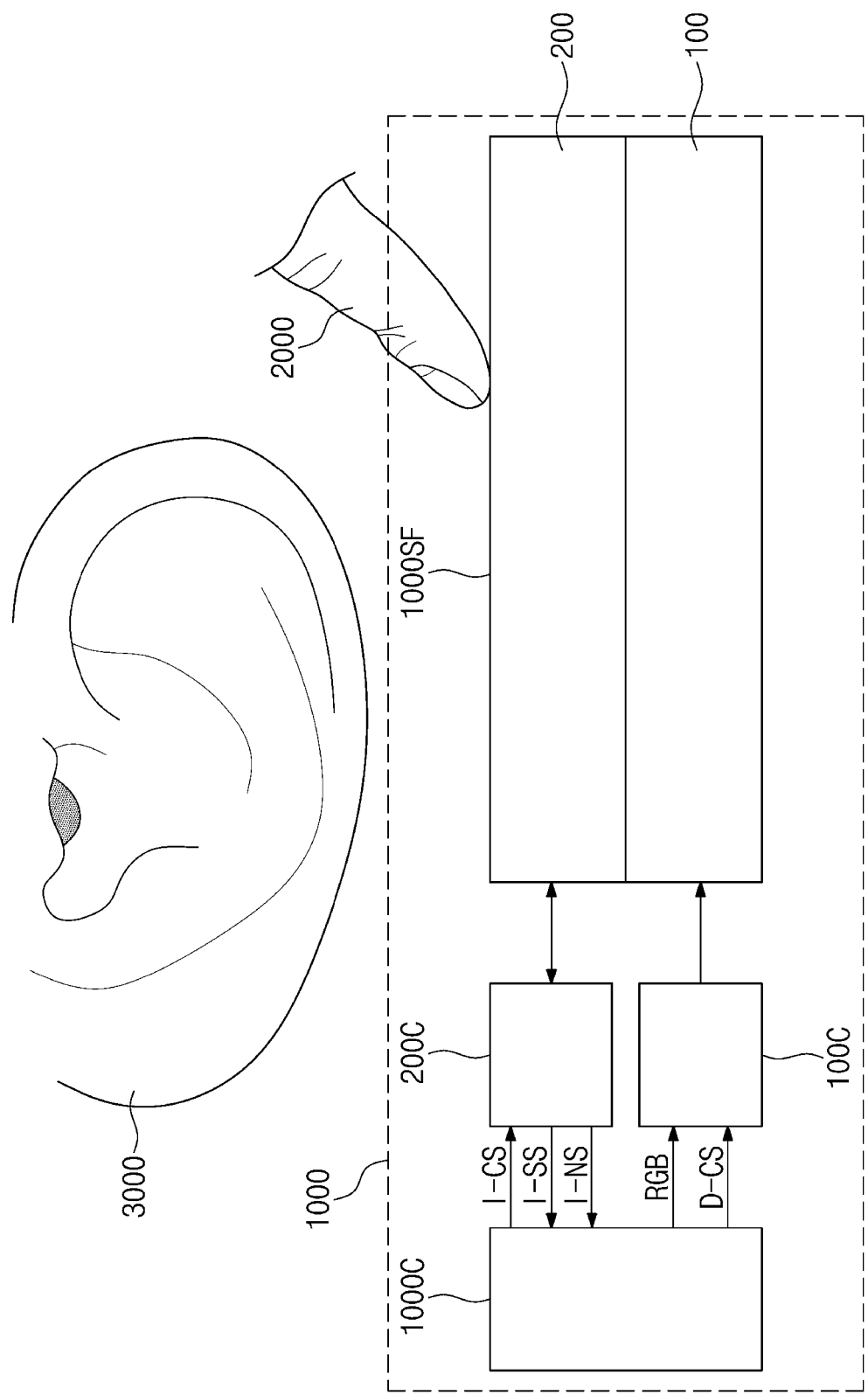
FIG. 2 illustrates a schematic diagram showing an operation of an electronic device according to an embodiment of the present inventive concept.

FIG. 2 illustrates a schematic diagram showing an operation of an electronic device according to an embodiment of the present inventive concept.

Referring to FIG. 2, the electronic device 1000 may include a display layer 100, a sensor layer 200, a display driver 100C, a sensor driver 200C, and a main driver 1000C.

The display layer 100 may be a component that substantially generates an image. The display layer 100 may be an emissive display layer, for example, an organic light emitting display layer, a quantum-dot display layer, a micro-LED display layer, or a nano-LED display layer. The display layer 100 may be called a display panel.

The sensor layer 200 may be located on the display layer 100. The sensor layer 200 may detect an external input 2000 or 3000 applied from the outside. The external input 2000 or 3000 may include any input means that can provide a variation in capacitance. For example, the sensor layer 200 may detect inputs not only from a passive-type input means such as a user's body, but from an active-type input means that provides transmission signals. The sensor layer 200 may be called a sensor, a touch layer, a touch panel, an input sensing layer, or an input sensing panel.

The main driver 1000C may control an overall operation of the electronic device 1000. For example, the main driver 1000C may control operations of the display driver 100C and the sensor driver 200C. The main driver 1000C may include at least one micro-processor, and may be called a host. The main driver 1000C may further include a graphic controller.

The display driver 100C may drive the display layer 100. The display driver 100C may receive an image data RGB and a control signal D-CS from the main driver 1000C. The control signal D-CS may include various signals. For example, the control signal D-CS may include an input vertical synchronizing signal, an input horizontal synchronizing signal, a main clock, and a data enable signal. Based on the control signal D-CS, the display driver 100C may generate a scan control signal and a data control signal that control driving of the display layer 100.

The sensor driver 200C may drive the sensor layer 200. The sensor driver 200C may receive a control signal I-CS from the main driver 1000C. The control signal I-CS may include a clock signal and a mode selection signal that determines a driving mode of the sensor layer 200.

The sensor driver 200C may calculate input coordinate information on the basis of a signal received from the sensor layer 200, and may provide the main driver 1000C with a coordinate signal I-SS that has the coordinate information. Based on the coordinate signal I-SS, the main driver 1000C executes an operation that corresponds to a user's input. For example, the main driver 1000C may drive the display driver 100C to display an application image on the display layer 100.

Based on a signal received from the sensor layer 200, the sensor driver 200C may detect proximity of an object 3000 spaced apart from a surface 1000SF of the electronic device

1000. The spaced-apart object 3000 may be called a hovering object. A user's ear, which approaches the electronic device 1000, is illustrated as an example of the spaced-apart object 3000. This, however, is merely exemplary, and the object 3000 may be a user's face. The sensor driver 200C may provide the main driver 1000C with a proximity sensing signal I-NS that has information of approaching substances. Based on the proximity sensing signal I-NS, the main driver 1000C may drive the display driver 100C to reduce brightness of an image displayed on the display layer 100 or to display no image on the display layer 100. For example, based on the proximity sensing signal I-NS, the main driver 1000C may turn off the screen of the electronic device 1000.

Figure 3A:
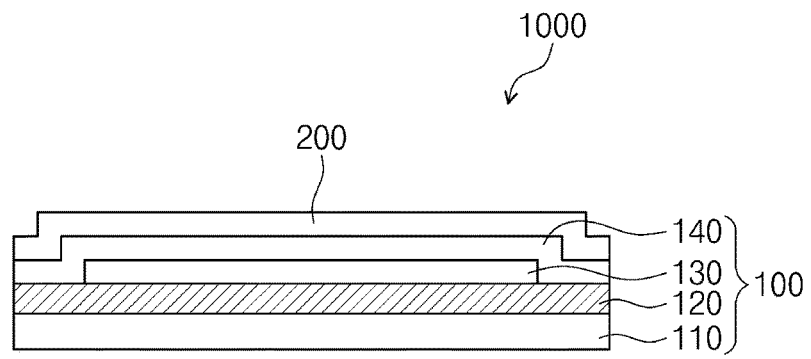
FIG. 3A illustrates a cross-sectional view showing an electronic device according to an embodiment of the present inventive concept.
Figure 3A:
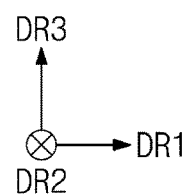

FIG. 3A illustrates a cross-sectional view showing an electronic device according to an embodiment of the present inventive concept.

Referring to FIG. 3A, the display layer 100 may include a base layer 110, a circuit layer 120, a light emitting element layer 130, and an encapsulation layer 140.

The base layer 110 may be a member that provides a base surface on which the circuit layer 120 is located. The base layer 110 may be a glass substrate, a metal substrate, or a polymer substrate. The present inventive concept, however, is not limited thereto, and the base layer 110 may be an inorganic layer, an organic layer, or a composite material layer.

The base layer 110 may have a multi-layered structure. For example, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be called a base barrier layer.

Each of the first and second synthetic resin layers may include a polyimide-based resin. Additionally or alternatively, each of the first and second synthetic resin layers may include at least one selected from acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. In this description, the language "X-based resin" means a resin that includes a functional group of X.

The circuit layer 120 may be located on the base layer 110. The circuit layer 120 may include a insulation layer, a semiconductor pattern, a conductive pattern, and a signal line. A coating or deposition process may be employed such that a insulation layer, a semiconductor layer, and a conductive layer are formed on the base layer 110, and then a photolithography process may be performed several times to selectively pattern the insulation layer, the semiconductor layer, and the conductive layer. Afterwards, the semiconductor pattern, the conductive pattern, and the signal line may be formed which are included in the circuit layer 120.

The light emitting element layer 130 may be located on the circuit layer 120. The light emitting element layer 130 may include the light emitting element. For example, the light emitting element layer 130 may include an organic light emitting material, a quantum dot, a quantum rod, a micro-LED, or a nano-LED.

The encapsulation layer 140 may be located on the light emitting element layer 130. The encapsulation layer 140 may protect the light emitting element layer 130 against moisture, oxygen, and foreign substances such as dust particles.

The sensor layer 200 may be located on the display layer 100. The sensor layer 200 may detect an external input applied from the outside. The external input may be a user's input. The user's input may include various types of external inputs such as part of user's body, light, heat, pen, and pressure.

A series of processes may be employed to form the sensor layer 200 on the display layer 100. In this case, the sensor layer 200 may be expressed as being directly located on the display layer 100. The phrase "directly located on" may mean that a third component is not located between the sensor layer 200 and the display layer 100. In this case, no adhesive member may be separately located between the sensor layer 200 and the display layer 100. Alternatively, the sensor layer 200 may be coupled through an adhesive member to the display layer 100. The adhesive member may include an ordinary adhesive or glue.

Although not shown, the electronic device 1000 may further include an antireflection layer and an optical layer that are located on the sensor layer 200. The antireflection layer may reduce a reflectance of external light incident from the outside of the electronic device 1000. The optical layer may increase front-side brightness of the electronic device 1000 by controlling a direction of light incident from the display layer 100.

Figure 3B:
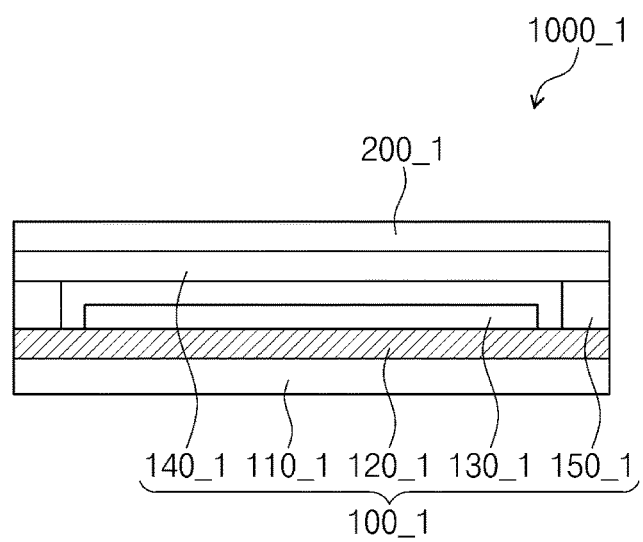
FIG. 3B illustrates a cross-sectional view showing an electronic device according to an embodiment of the present inventive concept.
Figure 3B:
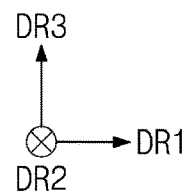

FIG. 3B illustrates a cross-sectional view showing an electronic device according to an embodiment of the present inventive concept.

Referring to FIG. 3B, an electronic device 1000_1 may include a display layer 100_1 and a sensor layer 200_1. The display layer 100_1 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may be a glass substrate, a metal substrate, or a polymer substrate, but the present inventive concept is not particularly limited thereto.

The coupling member 150_1 may be located between the base substrate 110_1 and the encapsulation substrate 140_1. The coupling member 150_1 may couple the encapsulation substrate 140_1 to the base substrate 110_1 or the circuit layer 120_1. The coupling member 150_1 may include an organic material or an inorganic material. For example, the inorganic material may include a frit seal, and the organic material may include a photo-curable resin or a photo-plastic resin. However, the material of the coupling member 150_1 is not limited to the example discussed above.

The sensor layer 200_1 may be directly located on the encapsulation substrate 140_1. The phrase "directly located on" may mean "a third component is not located between the sensor layer 200_1 and the encapsulation substrate 140_1." In this case, no adhesive member may be separately located between the sensor layer 200_1 and the display layer 100_1. The present inventive concept, however, is not limited thereto, and an adhesive layer may further be located between the sensor layer 200_1 and the encapsulation substrate 140_1.

Figure 4:
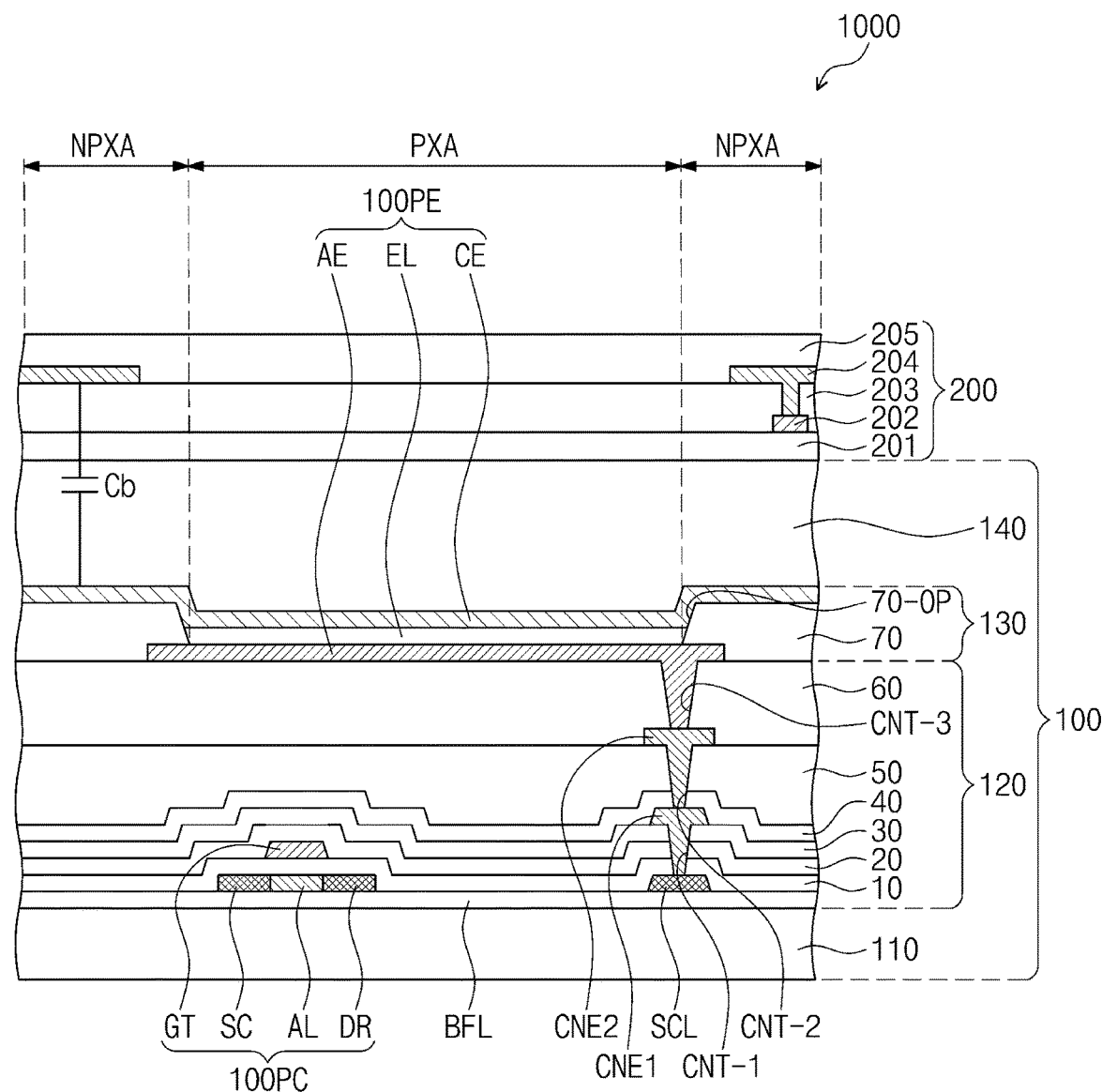
FIG. 4 illustrates a cross-sectional view showing an electronic device according to an embodiment of the present inventive concept.

FIG. 4 illustrates a cross-sectional view showing an electronic device according to an embodiment of the present inventive concept.

Referring to FIG. 4, at least one inorganic layer is formed on a top surface of the base layer 110. The inorganic layer may include at least one selected from aluminum oxide, titanium oxide, silicon oxide, silicon nitride, silicon oxynitride, zirconium oxide, and hafnium oxide. The inorganic layer may be formed multi-layered. The multi-layered inorganic layers may constitute a barrier layer or a buffer layer. In an embodiment, the display layer 100 is illustrated as including a buffer layer BFL.

The buffer layer BFL may increase a bonding force between the base layer 110 and the semiconductor pattern. The buffer layer BFL may include at least one selected from silicon oxide, silicon nitride, and silicon oxynitride. For example, the buffer layer BFL may include a structure in which a silicon oxide layer and a silicon nitride layer are alternately stacked.

The semiconductor pattern may be located on the buffer layer BFL. The semiconductor pattern may include polysilicon. The present inventive concept, however, is not limited thereto, and the semiconductor pattern may include amorphous silicon, low-temperature polycrystalline silicon, or an oxide semiconductor.

FIG. 4 merely depicts a portion of the semiconductor pattern, and the semiconductor pattern may further be located on another region. The semiconductor pattern may be arranged according to a specific rule across pixels. The semiconductor pattern may have different electrical characteristics based on whether the semiconductor pattern is doped or not. The semiconductor pattern may include a first region whose conductivity is high and a second region whose conductivity is low. The first region may be doped with n-type or p-type impurities. A P-type transistor may include a doped region implanted with P-type impurities, and an N-type transistor may include a doped region implanted with N-type impurities. The second region may be an undoped region or may be a doped region implanted with impurities whose concentration is lower than that of impurities doped into the first region.

The first region may have conductivity greater than that of the second region, and may substantially serve as an electrode or a signal line. The second region may substantially correspond to an active (or channel) of a transistor. For example, a portion of the semiconductor pattern may be an active of a transistor, another portion of the semiconductor pattern may be a source or drain of the transistor, and still another portion of the semiconductor pattern may be a connection electrode or a connection signal line.

Each of the pixels may have an equivalent circuit including seven transistors, one capacitor, and a light emitting element 100PE, and the equivalent circuit of the pixel may be modified in various shapes. FIG. 4 depicts by way of example one transistor 100PC and one light emitting element 100PE that are included in the pixel.

A source SC, an active AL, and a drain DR of the transistor 100PC may be formed from the semiconductor pattern. When viewed in cross-section, the source SC and the drain DR may extend in opposite directions from the active AL. FIG. 4 shows a portion of a connection signal line SCL formed from the semiconductor pattern. Although not shown separately, when viewed in plan, the connection signal line SCL may be electrically connected to the drain DR of the transistor 100PC.

A first insulation layer 10 may be located on the buffer layer BFL. The first insulation layer 10 may commonly overlap a plurality of pixels and may cover the semiconductor pattern. The first insulation layer 10 may be one or more of an inorganic layer and an organic layer, and may have a single-layered or multi-layered structure. The first insulation layer 10 may include at least one selected from aluminum oxide, titanium oxide, silicon oxide, silicon nitride, silicon oxynitride, zirconium oxide, and hafnium oxide. In an embodiment, the first insulation layer 10 may be a single-layered silicon oxide layer. Likewise the first insulation layer 10, an insulation layer of the circuit layer 120 which will be discussed below may be one or more of an inorganic layer and an organic layer, and may have a single-layered or multi-layered structure. The inorganic layer may include at least one of the materials mentioned above, but the present inventive concept is not limited thereto.

A gate GT of the transistor 100PC is located on the first insulation layer 10. The gate GT may be a portion of a metal pattern. The gate GT overlaps the active AL. The gate GT may serve as a mask in a process of doping the semiconductor pattern.

A second insulation layer 20 may be located on the first insulation layer 10, and may cover the gate GT. The second insulation layer 20 may commonly overlap the pixels. The second insulation layer 20 may be one or more of an inorganic layer and an organic layer, and may have a single-layered or multi-layered structure. The second insulation layer 20 may include at least one selected from silicon oxide, silicon nitride, and silicon oxynitride. In an embodiment, the second insulation layer 20 may have a multi-layered structure including a silicon oxide layer and a silicon nitride layer.

A third insulation layer 30 may be located on the second insulation layer 20. The third insulation layer 30 may have a single-layered or multi-layered structure. For example, the third insulation layer 30 may have a multi-layered structure including a silicon oxide layer and a silicon nitride layer.

A first connection electrode CNE1 may be located on the third insulation layer 30. The first connection electrode CNE1 may be coupled to the connection signal line SCL through a contact hole CNT-1 that penetrates the first, second, and third insulation layers 10, 20, and 30.

A fourth insulation layer 40 may be located on the third insulation layer 30. The fourth insulation layer 40 may be a single-layered silicon oxide layer. A fifth insulation layer 50 may be located on the fourth insulation layer 40. The fifth insulation layer 50 may be an organic layer.

A second connection electrode CNE2 may be located on the fifth insulation layer 50. The second connection electrode CNE2 may be coupled to the first connection electrode CNE1 through a contact hole CNT-2 that penetrates the fourth and fifth insulation layers 40 and 50.

A sixth insulation layer 60 may be located on the fifth insulation layer 50 and may cover the second connection electrode CNE2. The sixth insulation layer 60 may be an organic layer.

The light emitting element layer 130 may be located on the circuit layer 120. The light emitting element layer 130 may include the light emitting element 100PE. For example, the light emitting element layer 130 may include an organic light emitting material, a quantum dot, a quantum rod, a micro-LED, or a nano-LED. The following will describe an example in which the light emitting element 100PE is an organic light emitting element, but the present inventive concept is no particularly limited thereto.

The light emitting element 100PE may include a first electrode AE, an emission layer EL, and a second electrode CE.

The first electrode AE may be located on the sixth insulation layer 60. The first electrode AE may be connected to the second connection electrode CNE2 through a contact hole CNT-3 that penetrates the sixth insulation layer 60.

A pixel definition layer 70 may be located on the sixth insulation layer 60 and may cover a portion of the first electrode AE. An opening 70-OP is defined in the pixel definition layer 70. The opening 70-OP of the pixel definition layer 70 exposes at least a portion of the first electrode AE.

The active region (see 1000A of FIG. 1) may include an emission region PXA and a non-emission region NPXA adjacent to the emission region PXA. The non-emission region NPXA may surround the emission region PXA. In an embodiment, the emission region PXA may be defined to correspond to the portion of the first electrode AE, which portion is exposed to the opening 70-OP.

The emission layer EL may be located on the first electrode AE. The emission layer EL may be located on an area that corresponds to the opening 70-OP. For example, the emission layer EL may be formed on each of the pixels. When a plurality of emission layers EL are formed on corresponding pixels, the emission layers EL may each emit light having at least one selected from blue, red, and green colors. The present inventive concept, however, is not limited thereto, and the emission layer EL may be provided which is commonly connected to the pixels. In this case, the emission layer EL may provide blue light or white light.

The second electrode CE may be located on the emission layer EL. The second electrode CE may be located in common on a plurality of pixels, while having a single unitary shape.

Although not shown, a hole control layer may be located between the first electrode AE and the emission layer EL. The hole control layer may be located in common on the emission region PXA and the non-emission region NPXA. The hole control layer may include a hole transport layer and may further include a hole injection layer. An electron control layer may be located between the emission layer EL and the second electrode CE. The electron control layer may include an electron transport layer and may further include an electron injection layer. An open mask may be used to form the hole control layer and the electron control layer that are commonly located on a plurality of pixels.

The encapsulation layer 140 may be located on the light emitting element layer 130. The encapsulation layer 140 may include an inorganic layer, an organic layer, and an inorganic layer that are sequentially stacked, but no limitation is imposed on the constituent layers of the encapsulation layer 140.

The inorganic layers may protect the light emitting element layer 130 against moisture and oxygen, and the organic layer may protect the light emitting element layer 130 against foreign substances such as dust particles. The inorganic layers may include a silicon nitride layer, a silicon oxynitride layer, a silicon oxide layer, a titanium oxide layer, or an aluminum oxide layer. The organic layer may include an acryl-based organic layer, but the present inventive concept is not limited thereto.

The sensor layer 200 may include a base layer 201, a first conductive layer 202, a sensing insulation layer 203, a second conductive layer 204, and a cover insulation layer 205.

The base layer 201 may be an inorganic layer that includes at least one selected from silicon nitride, silicon oxynitride, and silicon oxide. Alternatively, the base layer 201 may be an organic layer that includes an epoxy-based resin, an acryl-based resin, or an imide-based resin. The base layer 201 may have a single-layered structure or a multi-layered structure in which layers are stacked along the third direction DR3.

Each of the first and second conductive layers 202 and 204 may have a single-layered structure or a multi-layered structure in which layers are stacked along the third direction DR3.

The single-layered conductive layer may include a metal layer or a transparent conductive layer. The metal layer may include molybdenum, silver, titanium, copper, aluminum, or an alloy thereof. The transparent conductive layer may include transparent conductive oxide, such as indium tin oxide (ITO), indium zinc oxide (IZO), zinc oxide (ZnO), or indium zinc tin oxide (IZTO). Additionally or alternatively, the transparent conductive layer may include a metal nanowire, a graphene, or a conductive polymer such as PEDOT.

The multi-layered conductive layer may include metal layers. The metal layers may include, for example, tri-layered structure of titanium/aluminum/titanium. The multi-layered conductive layer may include at least one metal layer and at least one transparent conductive layer.

At least one selected from the sensing insulation layer 203 and the cover insulation layer 205 may include an inorganic layer. The inorganic layer may include at least one selected from aluminum oxide, titanium oxide, silicon oxide, silicon nitride, silicon oxynitride, zirconium oxide, and hafnium oxide.

At least one selected from the sensing insulation layer 203 and the cover insulation layer 205 may include an organic layer. The organic layer may include at least one selected from an acryl-based resin, methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

A parasitic capacitance Cb may occur between the sensor layer 200 and the second electrode CE. The parasitic capacitance Cb may be called a base capacitance. A reduction in distance between the sensor layer 200 and the second electrode CE may induce an increase in parasitic capacitance Cb. The greater the parasitic capacitance Cb, the smaller ratio of variation in capacitance with respect to a reference value. The variation in capacitance indicates a capacitance change that occurs between before and after input from an input means such as the user's body (e.g., 3000 of FIG. 3).

The sensor driver (see 200C of FIG. 2) that processes signals detected from the sensor layer 200 may perform a leveling operation in which a value corresponding to the parasitic capacitance Cb is removed from the detected signal. The leveling operation may increase the ratio of variation in capacitance with respect to the reference value, which may result in an increase in sensitivity.

Figure 5:
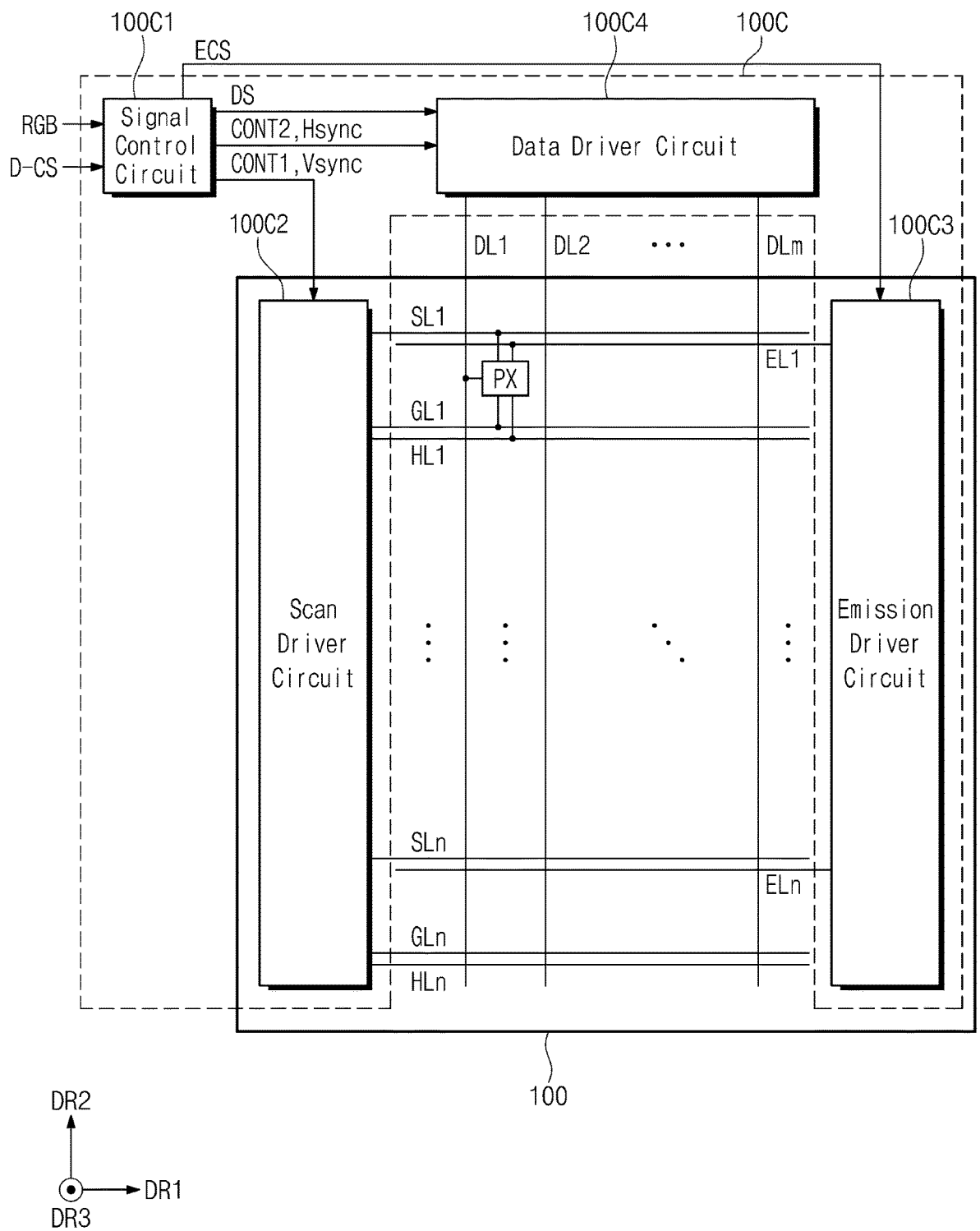
FIG. 5 illustrates a block diagram showing a display layer and a display driver according to an embodiment of the present inventive concept.

FIG. 5 illustrates a block diagram showing a display layer and a display driver according to an embodiment of the present inventive concept.

Referring to FIG. 5, the display layer 100 may include a plurality of first scan lines SL1 to SLn, a plurality of second scan lines GL1 to GLn, a plurality of third scan lines HL1 to HLn, a plurality of emission control lines EL1 to ELn, a plurality of data lines DL1 to DLm, and a plurality of pixels PX. The plurality of first scan lines SL1 to SLn may extend along the first direction DR1 and may be arranged spaced apart from each other in the second direction DR2, and the same may hold true for the plurality of second scan lines GL1 to GLn, the plurality of third scan lines HL1 to HLn, and the plurality of emission control lines EL1 to ELn. The plurality of data lines DL1 to DLm may extend along the second direction DR2 and may be arranged spaced apart from each other in the first direction DR1.

The display driver 100C may include a signal control circuit 100C1, a scan driver circuit 100C2, an emission driver circuit 100C3, and a data driver circuit 100C4.

The signal control circuit 100C1 may receive the image data RGB and the control signal D-CS from the main driver (see 1000C of FIG. 2). The control signal D-CS may include various signals. For example, the control signal D-CS may include an input vertical synchronizing signal, an input horizontal synchronizing signal, a main clock, and a data enable signal.

The signal control circuit 100C1 may generate, based on the control signal D-CS, a first control signal CONT1 and a vertical synchronizing signal Vsync, and may output the first control signal CONT1 and the vertical synchronizing signal Vsync to the scan driver circuit 100C2. The vertical synchronizing signal Vsync may be included in the first control signal CONT1.

The signal control circuit 100C1 may generate a third control signal ECS based on the control signal D-CS, and may output the third control signal ECS to the emission driver circuit 100C3.

The signal control circuit 100C1 may generate, based on the control signal D-CS, a second control signal CONT2 and a horizontal synchronizing signal Hsync, and may output the second control signal CONT2 and the horizontal synchronizing signal Hsync to the data driver circuit 100C4. The horizontal synchronizing signal Hsync may be included in the second control signal CONT2.

In addition, the signal control circuit 100C1 may output, to the data driver circuit 100C4, a driving signal DS obtained by processing the image data RGB in accordance with operating conditions of the display layer 100. The first control signal CONT1 and the second control signal CONT2 may be, but not particularly limited to, signals required for operations of the scan driver circuit 100C2 and the data driver circuit 100C4.

In response to the first control signal CONT1 and the vertical synchronizing signal Vsync, the scan driver circuit 100C2 drives the plurality of first control signals SL1 to SLn, the plurality of second scan lines GL1 to GLn, and the plurality of third scan lines HL1 to HLn. In an embodiment of the present inventive concept, the scan driver circuit 100C2 may be formed by the same process used to form the circuit layer (see 120 of FIG. 4) of the display layer 100, but the present inventive concept is not limited thereto. For example, the scan driver circuit 100C2 may be implemented as an integrated circuit (IC), and mounted directly on a certain area of the display layer 100 or mounted in a chip-on-film (COF) manner on a separate printed circuit board, with the result that the scan driver circuit 100C2 may be electrically connected to the display layer 100.

The emission driver circuit 100C3 receives the third control signal ECS from the signal control circuit 100C1. In response to the third control signal ECS, the emission driver circuit 100C3 may output emission control signals to the emission control lines EL1 to ELn.

The data driver circuit 100C4 may output, to the plurality of data lines DL1 to DLm, gray-scale voltages in response to the second control signal CONT2, the horizontal synchronizing signal Hsync, and the driving signal DS from the signal control circuit 100C1. The data driver circuit 100C4 may be implemented as an integrated circuit, and may be mounted directly on a certain region of the display layer 100 or mounted in a chip-on-film (COF) manner on a separate printed circuit board, with the result that the data driver circuit 100C4 may be electrically connected to the display layer 100. The present inventive concept, however, is not particularly limited thereto. For example, the data driver circuit 100C4 may be formed by the same process used to form the circuit layer (see 120 of FIG. 4) of the display layer 100.

Figure 6A:
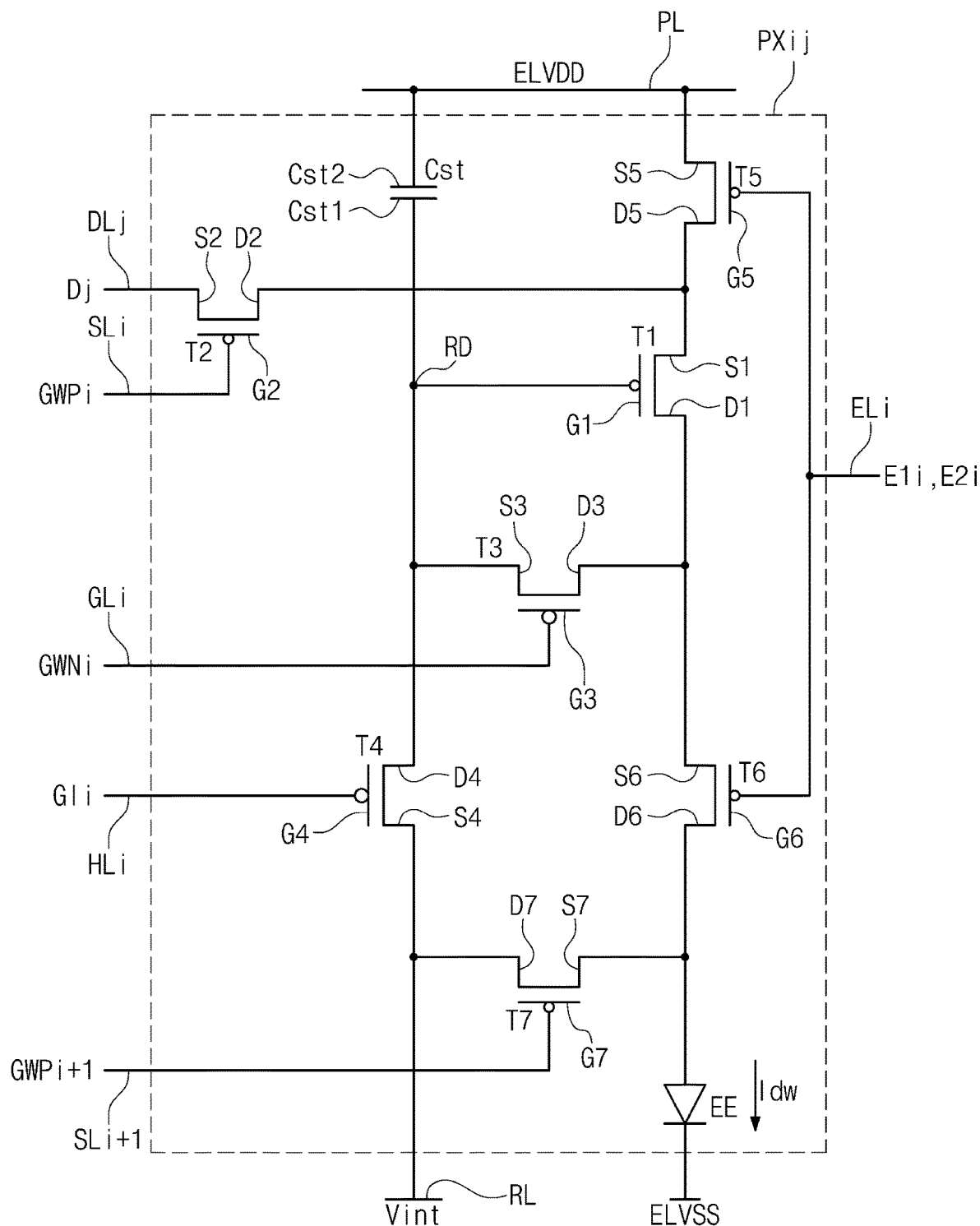
FIG. 6A illustrates an equivalent circuit diagram showing a pixel according to an embodiment of the present inventive concept.
Figure 6B:
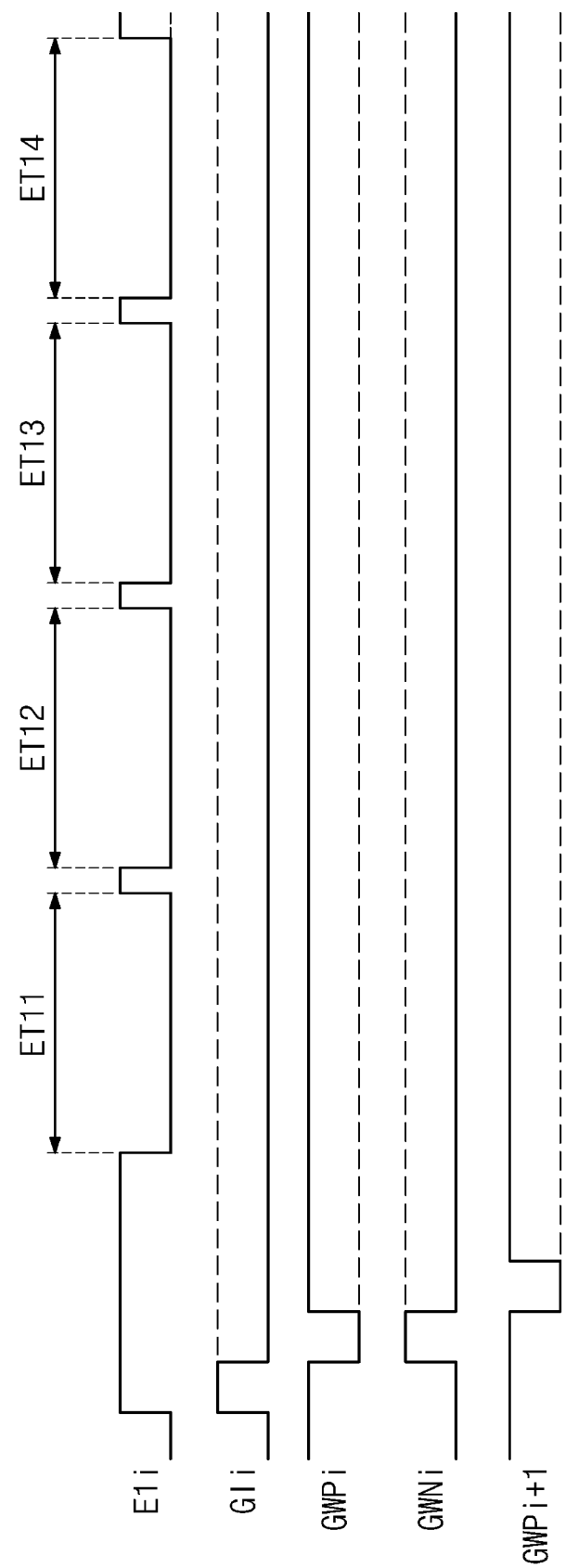
FIG. 6B illustrates timing diagrams of transmission signals for driving the pixel depicted in FIG. 6A.

FIG. 6A illustrates an equivalent circuit diagram showing a pixel according to an embodiment of the present inventive concept. FIG. 6B illustrates timing diagrams of transmission signals for driving the pixel depicted in FIG. 6A.

FIGS. 6A and 6B show by way of example a pixel PXij connected to a $j^{th}$ data line DLj, an $i^{th}$ first scan line SLi, an $i^{th}$ second scan line GLi, and an $i^{th}$ third scan line HLi.

In an embodiment, the pixel PXij may include first to seventh transistors T1 to T7, a capacitor Cst, and a light emitting element EE. In an embodiment, it is explained that the first, second, fifth, sixth, and seventh transistors T1, T2, T5, T6, and T7 are P-type transistors, and the third and fourth transistors T3 and T4 are N-type transistors. The present inventive concept, however, is not limited thereto, and the first to seventh transistors T1 to T7 may be implemented as one of P-type and N-type transistors. Alternatively, in an embodiment, one or more of the first to seventh transistors T1 to T7 may be omitted.

In an embodiment, the first transistor T1 may be a driving transistor, and the second transistor T2 may be a switching transistor. The capacitor Cst is coupled between a reference node RD and a first voltage line PL that receives a first power voltage ELVDD. The capacitor Cst includes a first electrode Cst1 coupled to the reference node RD and a second electrode Cst2 coupled to the first voltage line PL.

The first transistor T1 is coupled between the first voltage line PL and one electrode of the light emitting element EE. A source S1 of the first transistor T1 is electrically connected to the first voltage line PL. In this description, the phrase "electrically connected between a transistor and a signal line or between a transistor and a transistor" means "a source, a drain, or a gate of the transistor is integrally formed with the signal line or is connected through a connection electrode to the signal line." The first voltage line PL and the source S1 of the first transistor T1 may be provided therebetween with another transistor, for example, the fifth transistor T5.

A drain D1 of the first transistor T1 is electrically connected to an anode of the light emitting element EE. The drain D1 of the first transistor T1 and the anode of the light emitting element EE may be provided therebetween with another transistor, for example, the sixth transistor T6. A gate G1 of the first transistor T1 is electrically connected to the reference node RD.

The second transistor T2 is coupled between the $j^{th}$ data line DLj and the source S1 of the first transistor T1. A source S2 of the second transistor T2 is electrically connected to the $j^{th}$ data line DLj, and a drain D2 of the second transistor T2 is electrically connected to the source S1 of the first transistor T1. In an embodiment, a gate G2 of the second transistor T2 may be electrically connected to the $i^{th}$ first scan line SLi.

The third transistor T3 is coupled between the reference node RD and the drain D1 of the first transistor T1. A drain D3 of the third transistor T3 is electrically connected to the drain D1 of the first transistor T1, and a source S3 of the third transistor T3 is electrically connected to the reference node RD. A gate G3 of the third transistor T3 may be electrically connected to the $i^{th}$ second scan line GLi.

The fourth transistor T4 is coupled between the reference node RD and a second voltage line RL. A drain D4 of the fourth transistor T4 is electrically connected to the reference node RD, and a source S4 of the fourth transistor T4 is electrically connected to the second voltage line RL. A gate G4 of the fourth transistor T4 may be electrically connected to the $i^{th}$ third scan line HLi.

The fifth transistor T5 is coupled between the first voltage line PL and the source S1 of the first transistor T1. A source S5 of the fifth transistor T5 is electrically connected to the first voltage line PL, and a drain D5 of the fifth transistor T5 is electrically connected to the source S1 of the first transistor T1. A gate G5 of the fifth transistor T5 may be electrically connected to the $i^{th}$ emission control line ELi.

The sixth transistor T6 is coupled between the light emitting element EE and the drain D1 of the first transistor T1. A source S6 of the sixth transistor T6 is electrically connected to the drain D1 of the first transistor T1, and a drain D6 of the sixth transistor T6 is electrically connected to the anode of the light emitting element EE. A gate G6 of the sixth transistor T6 may be electrically connected to the $i^{th}$ emission control line ELi. In an embodiment of the present inventive concept, the gate G6 of the sixth transistor T6 may be connected to another signal line other than the gate G5 of the fifth transistor T5.

The seventh transistor T7 is coupled between the second voltage line RL and the drain D6 of the sixth transistor T6. A source S7 of the seventh transistor T7 is electrically connected to the drain D6 of the sixth transistor T6, and a drain D7 of the seventh transistor T7 is electrically connected to the second voltage line RL. A gate G7 of the seventh transistor T7 may be electrically connected to an $(i+)^{th}$ first scan line SLi+1.

The following will focus on a detailed operation of the pixel PXij with reference to FIGS. 6A and 6B. The display layer (see 100 of FIG. 5) displays an image at every frame interval. Each of the first scan line SLi, the second scan line GLi, the third scan line HLi, and the emission control line Eli is provided in plural, and these signal line are sequentially scanned FIG. 6B depicts a portion of one frame interval.

Referring to FIG. 6B, each of signals E1$i$, GWPi, GWNi, and GWPi+1 may have a high level for a certain interval and a low level for other certain interval. N-type transistors are turned on when corresponding signals have their high levels, and P-type transistors are turned on when corresponding signals have their low levels.

When a first emission control signal E1$i$ has a high level, the fifth transistor T5 and the sixth transistor T6 are turned off. When the fifth and sixth transistors T5 and T6 are turned off, no current path is formed between the first voltage line PL and the light emitting element EE. Therefore, an interval related thereto may be defined as a non-emission interval.

When a high level is given to a first scan signal GIi applied to the $i^{th}$ third scan line HLi, the fourth transistor T4 is turned on. When the fourth transistor T4 is turned on, an initialization voltage Vint initializes the reference node RD.

When a low level is given to a second scan signal GWPi applied to the $i^{th}$ first scan line SLi, and when a high level is given to a third scan signal GWNi applied to the $i^{th}$ second scan line GLi, the second transistor T2 and the third transistor T3 are turned on.

As the reference node RD is initialized due to the initialization voltage Vint, the first transistor T1 is in a turn-on state. When the first transistor T1 is turned on, the reference node RD is provided with a voltage that corresponds to a data signal Dj. In this case, the capacitor Cst stores the voltage that corresponds to the data signal Dj.

When a low level is given to a fourth scan signal GWPi+1 applied to the $(i+1)^{th}$ first scan line SLi+1, the seventh transistor T7 is turned on. As the seventh transistor T7 is turned on, the anode of the light emitting element EE is initialized into the initialization voltage Vint. A parasitic capacitor of the light emitting element EE may be discharged.

When the first emission control signal E1$i$ has a low level, the fifth transistor T5 and the sixth transistor T6 are turned on. When the fifth transistor T5 is turned on, the first transistor T1 is provide with the first power voltage ELVDD. When the sixth transistor T6 is turned on, the first transistor T1 is electrically coupled to the light emitting element EE. The light emitting element EE may generate light with brightness that corresponds to a driving current Idw provided thereto. Therefore, intervals ET11, ET12, ET13, and ET14 in each of which the first emission control signal E1$i$ has a low level may be defined as first activation intervals ET11, ET12, ET13, and ET14 and may be called emission intervals.

Figure 7A:
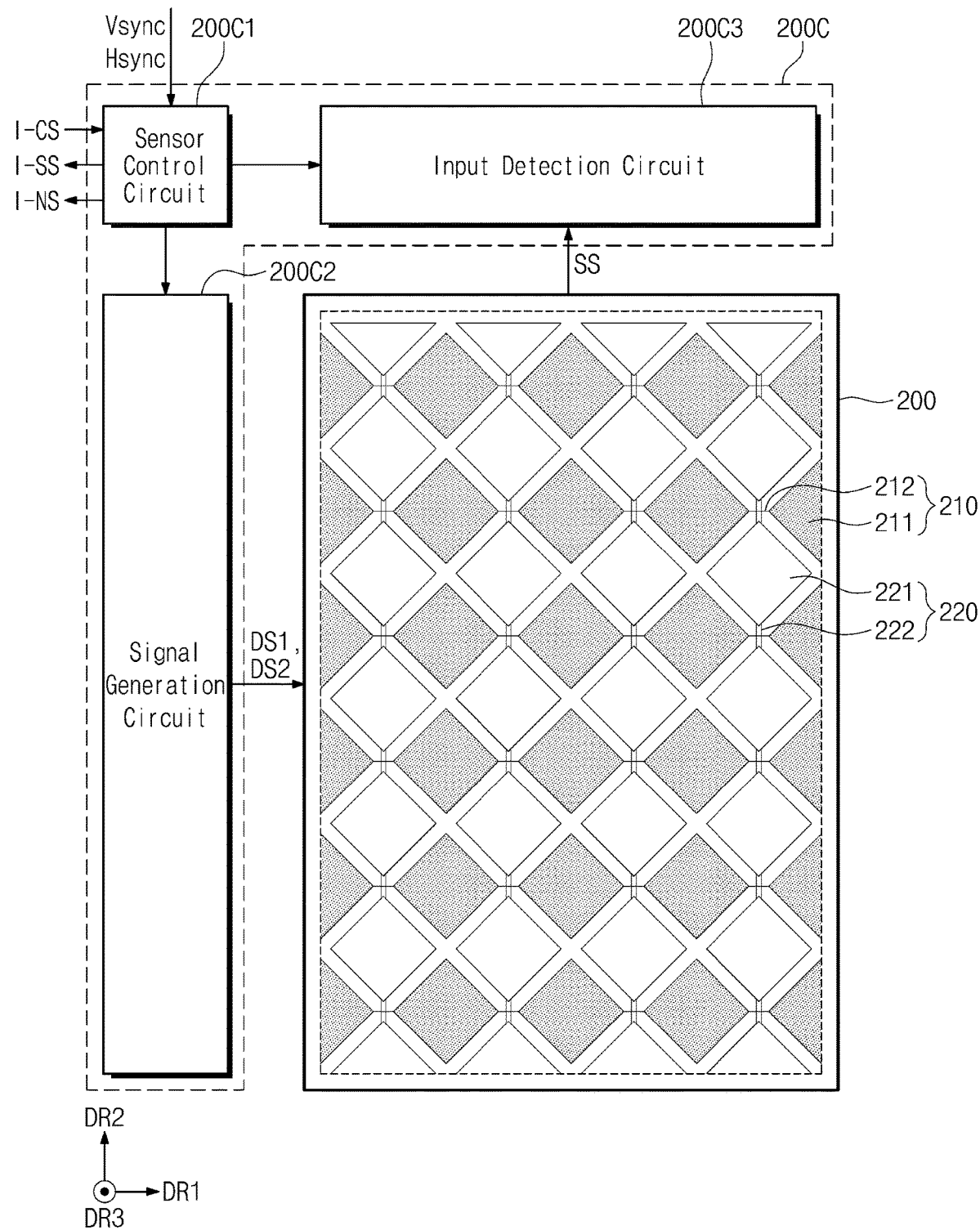
FIG. 7A illustrates a block diagram showing a sensor layer and a sensor driver according to an embodiment of the present inventive concept.

FIG. 7A illustrates a block diagram showing a sensor layer and a sensor driver according to an embodiment of the present inventive concept. FIG. 7B illustrates timing diagrams of transmission signals provided to the sensor layer depicted in FIG. 7A.

Referring to FIGS. 7A and 7B, the sensor layer 200 may include a plurality of electrodes 210 and a plurality of cross electrodes 220. The plurality of cross electrodes 220 may intersect the plurality of electrodes 210. Although not shown, the sensor layer 200 may further include a plurality of signal lines connected to the plurality of electrodes 210 and to the plurality of cross electrodes 220.

Each of the plurality of electrodes 210 may include a first segment 211 and a second segment 212. The first segment 211 and the second segment 212 may be connected to have a single unitary shape and located on the same layer. For example, the first segment 211 and the second segment 212 may be included in the second conductive layer (see 204 of FIG. 4).

Each of the plurality of cross electrodes 220 may include a sensing pattern 221 and a bridge pattern 222. Two sensing patterns 221 adjacent to each other may be electrically connected to each other through two bridge patterns 222, but the present inventive concept is not particularly limited thereto. The two bridge patterns 222 may be insulated from and crossed with the second segment 212. The sensing pattern 221 may be included in the second conductive layer (see 204 of FIG. 4), and the bridge pattern 222 may be included in the first conductive layer (see 202 of FIG. 4).

The sensor driver 200C may receive the control signal I-CS from the main driver (see 1000C of FIG. 2), and may provide the main driver (see 1000C of FIG. 2) with the coordinate signal I-SS or the proximity sensing signal I-NS.

The sensor driver 200C may be implemented as an integrated circuit (IC), and mounted directly on a certain area of the sensor layer 200 or mounted in a chip-on-film (COF) manner on a separate printed circuit board, with the result that the sensor driver 200C may be electrically connected to the sensor layer 200.

The sensor driver 200C may include a sensor control circuit 200C1, a signal generation circuit 200C2, and an input detection circuit 200C3. The sensor control circuit 200C1 may receive the vertical synchronizing signal Vsync and the horizontal synchronizing signal Hsync from the display driver 100C. Based on the control signal I-CS, the vertical synchronizing signal Vsync, and the horizontal synchronizing signal Hsync, the sensor control circuit 200C1 may control operations of the signal generation circuit 200C2 and the input detection circuit 200C3.

The signal generation circuit 200C2 may output first transmission signals DS1 or second transmission signals DS2 to the sensor layer 200, for example, to the electrodes 210. When the sensor layer 200 operates in a first sensing mode (or touch sensing mode), the signal generation circuit 200C2 may sequentially output the first transmission signals DS1 to the electrodes 210. When the sensor layer 200 operates in a second sensing mode (or proximity sensing mode), the signal generation circuit 200C2 may sequentially output the second transmission signals DS2 to the electrodes 210.

FIG. 7B depicts by way of example a waveform of a first transmission signal DS1$i$ provided to one electrode 210 in the first sensing mode and a waveform of a second transmission signal DS2$i$ provided to the one electrode 210 in the second sensing mode. The one electrode 210 may be one of six electrodes 210 illustrated in FIG. 7A.

In the first sensing mode, the sensor driver 200C may drive the sensor layer 200 at a first sensing frequency. For example, the signal generation circuit 200C2 may generate the first transmission signals DS1 having the first sensing frequency and may provide the sensor layer 200 with the first transmission signals DS1. In the first sensing mode, the sensor layer 200 may receive the first transmission signals DS1 and may operate at the first sensing frequency. The first sensing frequency may be about 480 Hz (hertz), 240 Hz, or 120 Hz, but the present inventive concept is not particularly limited thereto.

In the second sensing mode, the sensor driver 200C may drive the sensor layer 200 at a second sensing frequency. For example, the second sensing frequency may be less than the first sensing frequency. The signal generation circuit 200C2 may generate the second transmission signals DS2 having the second sensing frequency and may provide the sensor layer 200 with the second transmission signals DS2. In the second sensing mode, the sensor layer 200 may receive the second transmission signals DS2 and may operate at the second sensing frequency. The second sensing frequency may be about 90 Hz or 60 Hz, but the present inventive concept is not particularly limited thereto.

FIG. 7B depicts by way of example that the first sensing frequency is about 120 Hz and the second sensing frequency is about 60 Hz. The first transmission signal DS1$i$ may have a period SF1 of about 8.33 milliseconds, and the second transmission signal DS2$i$ may have a period SF2 of about 16.67 milliseconds. The reduction in frequency may cause the second transmission signal DS2$i$ to have an applying time greater than that of the first transmission signal DS1$i$.

The first transmission signal DS1$i$ may be a signal that swings between about 0 volt and a first voltage DVS1, and the second transmission signal DS2$i$ may be a signal that swings between about 0 volt and a second voltage DVS2. The second voltage DVS2 may have a voltage level higher than that of the first voltage DVS1. Alternatively, the first transmission signal DS1$i$ may be a signal that swings between a first negative voltage and a first positive voltage, and the second transmission signal DS2$i$ may be a signal that swings between a second negative voltage and a second positive voltage. In this case, the second negative voltage may have a voltage level lower than that of the first negative voltage, and the second positive voltage may have a voltage level higher than that of the first positive voltage. For example, an amplitude of the second transmission signal DS2$i$ may be greater than that of the first transmission signal DS1$i$.

According to an embodiment of the present inventive concept, as the second transmission signal DS2$i$ is allowed to have a frequency less than that of the first transmission signal DS1$i$ and to have a voltage level higher than that of the first transmission signal DS1$i$, the sensor layer 200 may increase in proximity sensing distance. In addition, there may be an increase in amount of capacitance variation that occurs when the object 3000 approaches, and thus it may be possible to reduce a time required to detect the approach of the object 3000, which may result in an improvement in proximity sensing capability in the second sensing mode (or proximity sensing mode).

Referring back to FIG. 7A, the input detection circuit 200C3 may receive sensing signals SS from the sensor layer 200. For example, the input detection circuit 200C3 may receive the sensing signals SS from the cross electrodes 220. The input detection circuit 200C3 may covert analog signals into digital signals. For example, the input detection circuit 200C3 may amplify and filter the sensing signals SS received in analog form, and may convert the filtered signals into digital signals.

In FIG. 7A, a case is exemplarily explained where the electrodes 210 are receiving electrodes and the cross electrodes 220 are transmitting electrodes, but the present inventive concept is not particularly limited thereto. For example, the electrodes 210 may serve as transmitting electrodes, and the cross electrodes 220 may serve as receiving electrodes.

Figure 8:
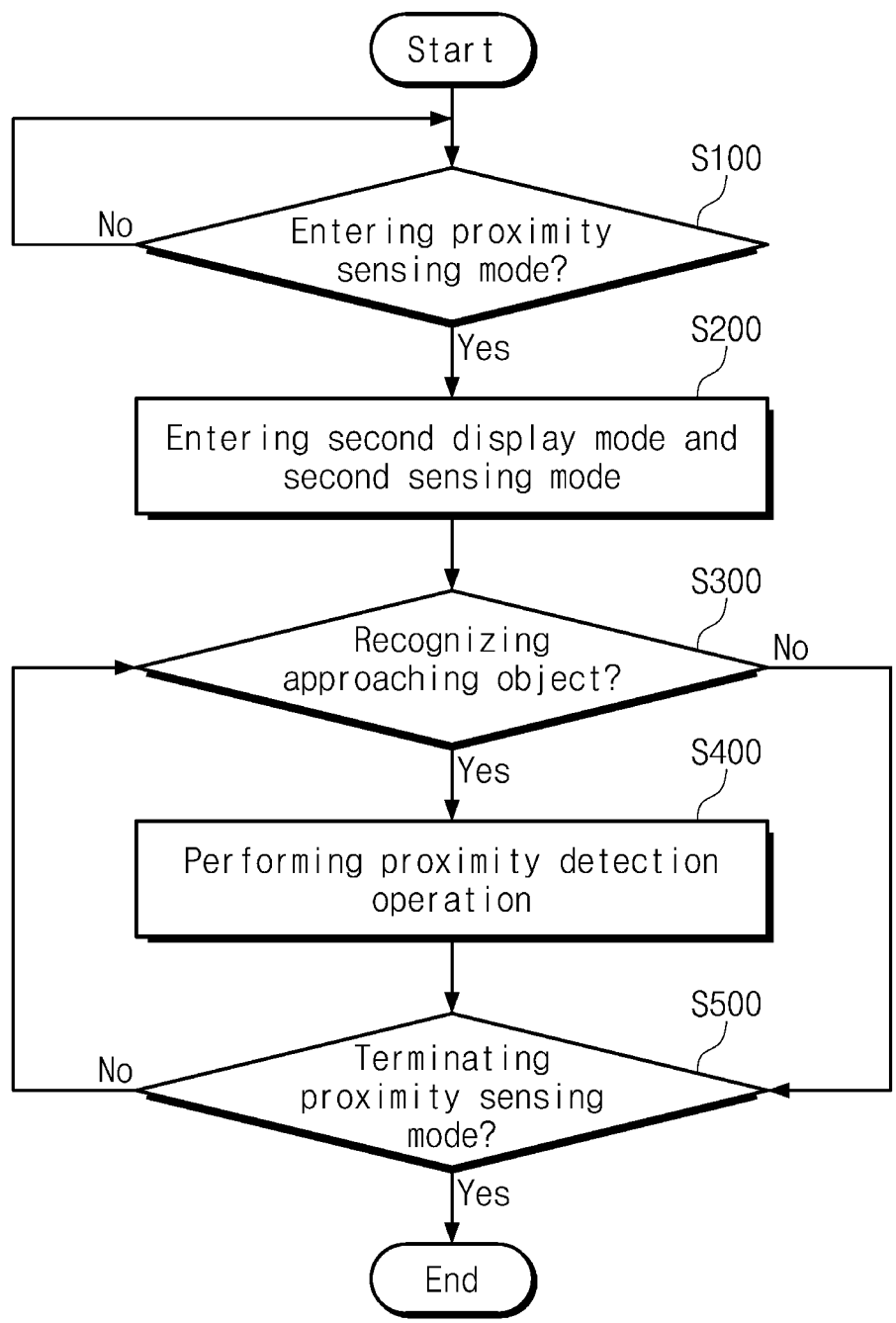
FIG. 8 illustrates a flow chart showing an operation in a proximity sensing mode according to an embodiment of the present inventive concept.

FIG. 8 illustrates a flow chart showing an operation in proximity sensing mode according to an embodiment of the present inventive concept.

Referring to FIGS. 2 and 8, the main driver 1000C determines whether the electronic device 1000 enters a proximity sensing mode (S100). For example, when the electronic device 1000 enters a voice call mode, the main driver 1000C may determine that the proximity sensing mode is required.

When the proximity sensing mode is not entered, the main driver 1000C may control the display driver 100C to drive the display layer 100 in a first display mode and control the sensor driver 200C to drive the sensor layer 200 in a first sensing mode.

When the proximity sensing mode is entered, the main driver 1000C may control the display driver 100C to drive the display layer 100 in a second display mode and control the sensor driver 200C to drive the sensor layer 200 in a second sensing mode. The display layer 100 may enter the second display mode, and the sensor layer 200 may enter the second sensing mode (S200).

When the first display mode is changed into the second display mode, adjustment may be made to a waveform of an emission control signal provided to the display layer 100. The waveform adjustment of the emission control signal may reduce noise of a signal obtained in the sensor layer 200 in the proximity sensing mode, which may result in an improvement in proximity sensing capability. The following will discuss the waveform adjustment of an emission control signal in the second display mode.

The sensor driver 200C generates the proximity sensing signal I-NS on the basis of the sensing signals SS received from the sensor layer 200, and the main driver 1000C determines whether an approaching substance is recognized or not on the basis of the proximity sensing signal I-NS (S300). For example, it may be determined that the approaching substance is recognized when detecting touch whose area is equal to or greater than that can be perceived with a user's ear or cheek.

As a result of determination, when the approaching substance is recognized, a proximity sensing operation may be performed (S400). For example, based on the proximity sensing signal I-NS, the main driver 1000C may turn off the display layer 100.

Afterwards, the main driver 1000C determines whether the proximity sensing mode is terminated or not (S500). For example, when a call is completed or a speaker call mode is executed, it may be determined that the proximity sensing mode is terminated. When the proximity sensing mode is terminated, the main driver 1000C may control the display driver 100C to drive the display layer 100 in the first display mode and control the sensor driver 200C to drive the sensor layer 200 in the first sensing mode.

When the proximity sensing mode is not terminated, the main driver 1000C may perform again the step S300 of determining whether the approaching substance is recognized or not based on the proximity sensing signal I-NS. When it is determined that the approaching substance is not recognized, the main driver 1000C determines whether the proximity sensing mode is terminated or not (S500).

Figure 9A:
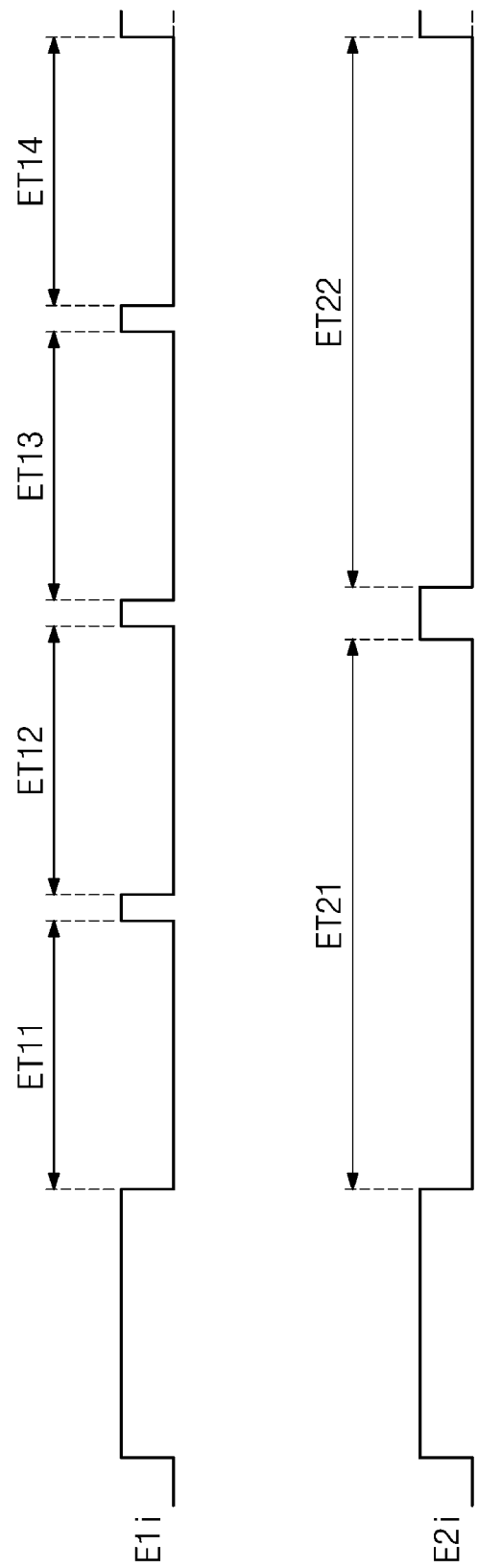
FIG. 9A illustrates timing diagrams of a first emission control signal and a second emission control signal according to an embodiment of the present inventive concept.

FIG. 9A illustrates timing diagrams of a first emission control signal and a second emission control signal according to an embodiment of the present inventive concept.

Referring to FIGS. 5, 6A, and 9A, there are exemplary illustrations of a first emission control signal E1$i$ and a second emission control signal E2$i$ that are provided to one ELi of the emission control lines EL1 to ELn.

When the sensor layer (see 200 of FIG. 2) operates in the first sensing mode (or touch sensing mode), the display layer 100 may be driven in the first display mode. In this case, the display driver 100C may output the first emission control signal E1$i$ to the emission control line ELi.

When the sensor layer (see 200 of FIG. 2) operates in the second sensing mode (or proximity sensing mode), the display layer 100 may be driven in the second display mode. In this case, the display driver 100C may output the second emission control signal E2$i$ to the emission control line ELi.

A waveform of the second emission control signal E2$i$ may be different from that of the first emission control signal E1$i$. For example, a length of an interval in which the first emission control signal E1$i$ is activated may be shorter than that of an interval in which the second emission control signal E2$i$ is activated. An activation interval (or emission interval) may be defined to refer to an interval in which a low level is given to each of the first and second emission control signals E1$i$ and E2$i$.

Because the emission time is longer when the second emission control signal E2$i$ is applied than when the first emission control signal E1$i$ is applied, in order to display an image of the same brightness, intensity of driving current Idw that flows through the light emitting element EE in the second display mode may be less than that of driving current Idw that flows through the light emitting element EE in the first display mode. In the case where intensity of driving current Idw is reduced, it may be possible to decrease noise induced from the display layer 100, which noise is included in a signal obtained in the sensor layer (see 200 of FIG. 2) in the proximity sensing mode. Accordingly, the sensor layer (see 200 of FIG. 2) may improve in proximity sensing capability.

Referring to FIG. 9A, during one frame interval in which an image is displayed on the display layer 100, the first emission control signal E1$i$ may have a plurality of first activation intervals ET11, ET12, ET13, and ET14, and the second emission control signal E2$i$ may have a plurality of second activation intervals ET21 and ET22. The first number of the plurality of first activation intervals ET11, ET12, ET13, and ET14 may be greater than the second number of the plurality of second activation intervals ET21 and ET22.

FIG. 9A depicts by way of example that, during one frame interval, the first emission control signal E1$i$ has four cycles of activation intervals (or emission intervals), and the second emission control signal E2$i$ has two cycles of activation intervals, but the present inventive concept is not particularly limited thereto. For example, the first emission control signal E1$i$ may have eight cycles of activation intervals, and the second emission control signal E2$i$ may have two or four cycles of activation intervals. For another example, the first emission control signal E1$i$ may have sixteen cycles of activation intervals, and the second emission control signal E2$i$ may have two, four, or eight cycles of activation intervals.

A sum total of lengths of the first activation intervals ET11, ET12, ET13, and ET14 may be less than that of lengths of the second activation intervals ET21 and ET22. In addition, a length of each of the first activation intervals ET11, ET12, ET13, and ET14 may be less than that of each of the second activation intervals ET21 and ET22. For example, when a reference length is defined as L, the length of each of the first activation intervals ET11, ET12, ET13, and ET14 may be given as 0.2 L, and the length of each of the second activation intervals ET21 and ET22 may be given as 0.45 L. In other words, the expression of 0.8 L may be given as a total length of an interval in which the first emission control signal E1$i$ is activated, and the expression of 0.9 L may be given as a total length of an interval in which the second emission control signal E2$i$ is activated. When the first emission control signal E1$i$ is provided, the driving current Idw that flows through the light emitting element EE may have intensity represented by I. When the second emission control signal E2$i$ is provided, the driving current Idw that flows through the light emitting element EE may have intensity represented by (8/9)I. In the case where intensity of driving current Idw is reduced, it may be possible to decrease noise induced from the display layer 100, which noise is included in a signal obtained in the sensor layer (see 200 of FIG. 2) in the proximity sensing mode. Accordingly, the sensor layer (see 200 of FIG. 2) may improve in proximity sensing capability.

Figure 9B:
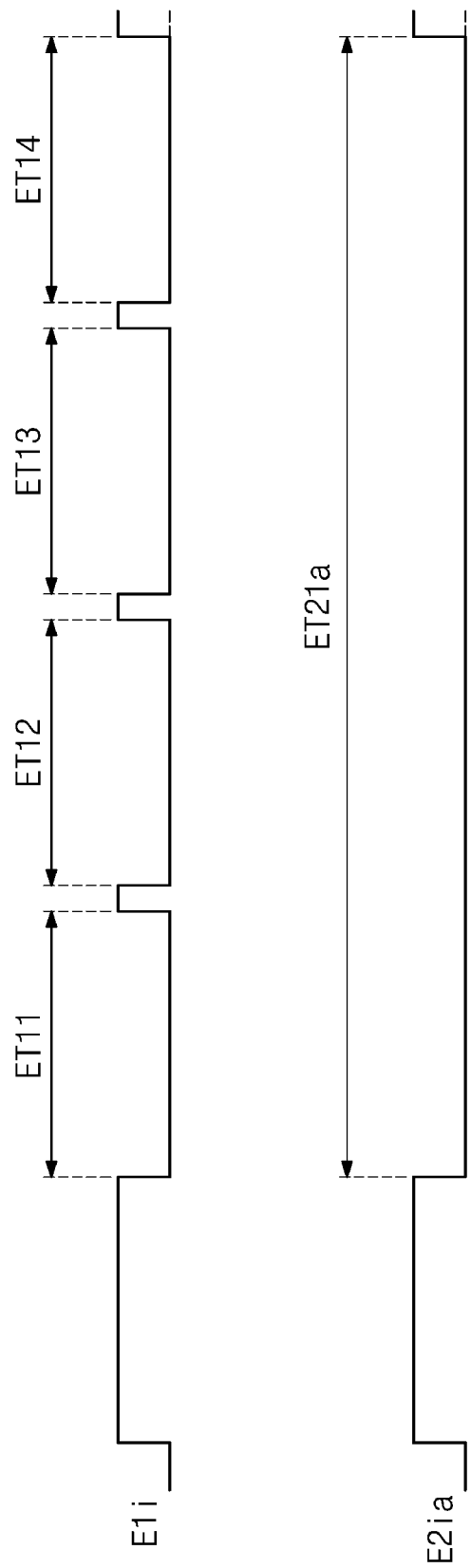
FIG. 9B illustrates timing diagrams of a first emission control signal and a second emission control signal according to an embodiment of the present inventive concept.

FIG. 9B illustrates timing diagrams of a first emission control signal and a second emission control signal according to an embodiment of the present inventive concept.

Referring to FIGS. 5, 6A, and 9B, there are exemplary illustrations of a first emission control signal E1$i$ and a second emission control signal E2$ia$ that are provided to one ELi of the emission control lines EL1 to ELn.

When the sensor layer (see 200 of FIG. 2) operates in the first sensing mode (or touch sensing mode), the display driver 100C may output the first emission control signal E1$i$ to the emission control line ELi. When the sensor layer (see 200 of FIG. 2) operates in the second sensing mode (or proximity sensing mode), the display driver 100C may output the second emission control signal E2$ia$ to the emission control line ELi.

Referring to FIG. 9B, during one frame interval in which an image is displayed on the display layer 100, the first emission control signal E1$i$ may have a plurality of first activation intervals ET11, ET12, ET13, and ET14, and the second emission control signal E2$ia$ may have a single second activation interval ET21$a$. FIG. 9B depicts by way of example that the first emission control signal E1$i$ has four cycles of activation intervals (or emission intervals) during one frame interval, but the first emission control signal E1$i$ may include two, eight, or sixteen cycles of activation intervals (or emission intervals).

A sum total of lengths of the first activation intervals ET11, ET12, ET13, and ET14 may be less than a length of the second activation interval ET21a. A reference length "L" may be defined to refer to a length of an activation interval when an emission control signal is activated in a single cycle during one frame interval. The length of each of the first activation intervals ET11, ET12, ET13, and ET14 may be given as 0.2 L, and the length of the second activation interval ET21a may be given as L.

When the first emission control signal E1i is provided, the driving current Idw that flows through the light emitting element EE may have intensity represented by I. When the second emission control signal E2ia is provided, the driving current Idw that flows through the light emitting element EE may have intensity represented by (8/10)I. In the case where intensity of driving current Idw is reduced, it may be possible to decrease noise induced from the display layer 100, which noise is included in a signal obtained in the sensor layer (see 200 of FIG. 2) in the proximity sensing mode. Accordingly, the sensor layer (see 200 of FIG. 2) may improve in proximity sensing capability.

As the sensor layer (see 200 of FIG. 2) has improved sensitivity, the second sensing mode may serve as a proximity sensing mode that detects an object (hovering object) spaced apart from the surface (see 1000SF of FIG. 2) of the electronic device (see 1000 of FIG. 2). For example, the sensor layer 200 that operates in the second sensing mode may be utilized as a proximity sensor. In this case, a proximity sensor may be omitted from the electronic device 1000, and accordingly the electronic device 1000 may decrease in fabrication cost.

Figure 10A:
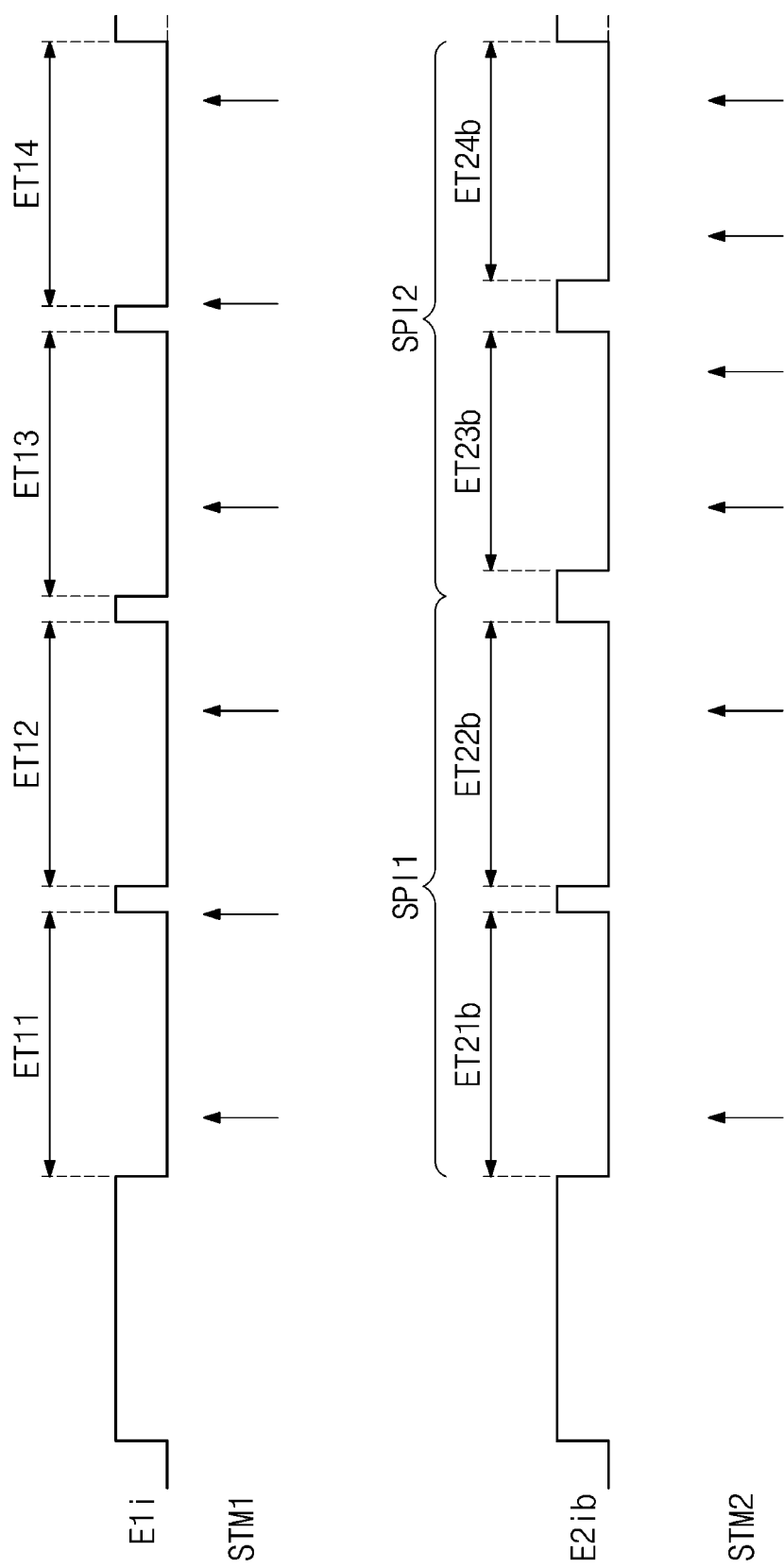
FIG. 10A illustrates timing diagrams of a first emission control signal and a second emission control signal according to an embodiment of the present inventive concept.

FIG. 10A illustrates timing diagrams of a first emission control signal and a second emission control signal according to an embodiment of the present inventive concept.

In FIGS. 5, 6A, and 10A, there are exemplary illustrations of a first emission control signal E1i and a second emission control signal E2ib that are provided to one ELi of the emission control lines EL1 to ELn.

When the sensor layer (see 200 of FIG. 2) operates in the first sensing mode (or touch sensing mode), the display driver 100C may output the first emission control signal E1i to the emission control line ELi. When the sensor layer (see 200 of FIG. 2) operates in the second sensing mode (or proximity sensing mode), the display driver 100C may output the second emission control signal E2ib to the emission control line ELi.

Referring to FIG. 10A, during one frame interval in which an image is displayed on the display layer 100, the first emission control signal E1i may have a plurality of first activation intervals ET11, ET12, ET13, and ET14, and the second emission control signal E2ib may have a plurality of second activation intervals ET21b, ET22b, ET23b, and ET24b. During one frame interval in which an image is displayed on the display layer 100, the number of the plurality of first activation intervals ET11, ET12, ET13, and ET14 may be the same as that of the plurality of second activation intervals ET21b, ET22b, ET23b, and ET24b. FIG. 10A depicts by way of example that each of the first and second emission control signals E1i and E2ib has four cycles of activation intervals (or emission intervals) during one frame interval, but the present inventive concept is not particularly limited thereto.

A sum total of lengths of the first activation intervals ET11, ET12, ET13, and ET14 may be greater than that of lengths of the second activation intervals ET21b, ET22b, ET23b, and ET24b. The second activation intervals ET21b, ET22b, ET23b, and ET24b may include first sub-activation intervals ET21b and ET22b and second sub-activation intervals ET23b and ET24b. A length of each of the second sub-activation intervals ET23b and ET24b may be less than that of each of the first sub-activation intervals ET21b and ET22b. For example, the expression of 0.2 L may be given as the length of each of the first activation intervals ET11, ET12, ET13, and ET14 and each of the first sub-activation intervals ET21b and ET22b. The length of each of the second sub-activation intervals ET23b and ET24b may be given as 0.15 L.

Because the emission time is shorter when the second emission control signal E2ib is applied than when the first emission control signal E1i is applied, in order to display an image of the same brightness, intensity of driving current Idw that flows through the light emitting element EE in the second display mode may be greater than that of driving current Idw that flows through the light emitting element EE in the first display mode. In contrast, the non-emission time may be longer when the second emission control signal E2ib is applied than when the first emission control signal E1i is applied.

The sensor driver (see 200C of FIG. 7A) may receive sensing signals from the sensor layer (see 200 of FIG. 7A), and may sample and convert the sensing signals into digital data. According to an embodiment of the present inventive concept, the sensor driver (see 200C of FIG. 7A) may apply weights to the sensing signals that are sensed in a second duration SPI2 including the second sub-activation intervals ET23b and ET24b, and may convert the weighted sensing signals into digital data.

For example, FIG. 10A depicts first and second sampling timings STM1 and STM2. Referring to the first sampling timing STM1, in the first sensing mode (or touch sensing mode), the sensor driver (see 200C of FIG. 7A) may sample the sensing signals at a regular interval. Alternatively, referring to the second sampling timing STM2, in the second sensing mode (or proximity sensing mode), the sensor driver (see 200C of FIG. 7A) may intensively sample the sensing signals in a specific interval.

The second emission control signal E2ib is defined to have a first duration SPI1 including the first sub-activation intervals ET21b and ET22b and a second duration SPI2 including the second sub-activation intervals ET23b and ET24b. A waveform of the second emission control signal E2ib may be adjusted such that the length of each of the second sub-activation intervals ET23b and ET24b may become less than that of each of the first sub-activation intervals ET21b and ET22b. In this case, a length of a non-emission interval included in second duration SPI2 may be greater than that of a non-emission interval included in the first duration SPI1. Therefore, noise induced from the display layer 100 included in a signal obtained in the second duration SPI2 may be smaller than that induced from the display layer 100 included in a signal obtained in the first duration SPI1.

The number of times of sampling the sensing signals SS may be greater in the second duration SPI2, in which noise is relatively small, than in the first duration SPI1, and thus the sensor layer (see 200 of FIG. 2) may improve in proximity sensing capability.

FIG. 10B illustrates timing diagrams of a first emission control signal and a second emission control signal according to an embodiment of the present inventive concept.

Referring to FIGS. 5, 6A, and 10B, there are exemplary illustrations of a first emission control signal E1ia and a second emission control signal E2*ic* that are provided to one ELi of the emission control lines EL1 to ELn.

When the sensor layer (see 200 of FIG. 2) operates in the first sensing mode (or touch sensing mode), the display driver 100C may output the first emission control signal E1*ia* to the emission control line ELi. When the sensor layer (see 200 of FIG. 2) operates in the second sensing mode (or proximity sensing mode), the display driver 100C may output the second emission control signal E2*ic* to the emission control line ELi.

Referring to FIG. 10A, during one frame interval in which an image is displayed on the display layer 100, the first emission control signal E1*ia* may have a plurality of first activation intervals ET11*a* and ET12*a*, and the second emission control signal E2*ic* may have a plurality of second activation intervals ET21*c* and ET22*c*. During one frame interval in which an image is displayed on the display layer 100, the number of the plurality of first activation intervals ET11*a* and ET12*a* may be the same as that of the plurality of second activation intervals ET21*c* and ET22*c*. FIG. 10B depicts by way of example that each of the first and second emission control signals E1ia and E2*ic* has two cycles of activation intervals (or emission intervals), but the present inventive concept is not particularly limited thereto.

A sum total of lengths of the first activation intervals ET11*a* and ET12*a* may be greater than that of lengths of the second activation intervals ET21*c* and ET22*c*. The second activation intervals ET21*c* and ET22*c* may include a first sub-activation interval ET21*c* and a second sub-activation interval ET22*c*. A length of the second sub-activation interval ET22*c* may be less than that of the first sub-activation interval ET21*c*. For example, an expression of 0.45 L may be given as the length of each of the first activation intervals ET11*a* and ET12*a* and the length of the first sub-activation interval ET21*c*. The length of the second sub-activation interval ET22*c* may be given as 0.3 L.

Because the emission time is shorter when the second emission control signal E2*ic* is applied than when the first emission control signal E1*ia* is applied, in order to display an image of the same brightness, intensity of driving current Idw that flows through the light emitting element EE in the second display mode may be greater than that of driving current Idw that flows through the light emitting element EE in the first display mode. In contrast, the non-emission time may be longer when the second emission control signal E2*ic* is applied than when the first emission control signal E1*ia* is applied.

The sensor driver (see 200C of FIG. 7A) may receive sensing signals from the sensor layer (see 200 of FIG. 7A), and may sample and convert the sensing signals into digital data. According to an embodiment of the present inventive concept, the sensor driver (see 200C of FIG. 7A) may apply weights to the sensing signals that are sensed in a second duration SPI2 including the second sub-activation interval ET22*c*, and may convert the weighted sensing signals into digital data.

A first duration SPI1 is defined which includes the first sub-activation interval ET21*c*, and a second duration SPI2 is defined which includes the second sub-activation interval ET22*c*. A waveform of the second emission control signal E2*ic* may be adjusted such that the length of the second sub-activation interval ET22*c* may become less than that of the first sub-activation interval ET21*c*. In this case, a length of a non-emission interval included in second duration SPI2 may be greater than that of a non-emission interval included in the first duration SPI1. Therefore, noise induced from the display layer 100 included in a signal obtained in the second duration SPI2 may be smaller than that induced from the display layer 100 included in a signal obtained in the first duration SPI1.

Referring to the first sampling timing STM1, in the first sensing mode (or touch sensing mode), the sensor driver (see 200C of FIG. 7A) may sample the sensing signals at a regular interval. The sensor driver (see 200C of FIG. 7A) may convert the sampled signals into digital data. Alternatively, referring to the second sampling timing STM2, in the second sensing mode (or proximity sensing mode), the sensor driver (see 200C of FIG. 7A) may intensively sample the sensing signals in a specific interval. For example, the number of times of sampling the sensing signals may be greater in the second duration SPI2 than in the first duration SPI1.

In an embodiment, in the second sensing mode, the sensor driver (see 200C of FIG. 2A) may sample the sensing signals at a regular interval. Afterwards, the sampled signals may be converted into digital data by applying more weights to signals obtained in the second duration SPI2 than to signals obtained in the first duration SPI1. For example, more weight may be applied to signals obtained in a duration in which noise is relatively small.

Figure 11A:
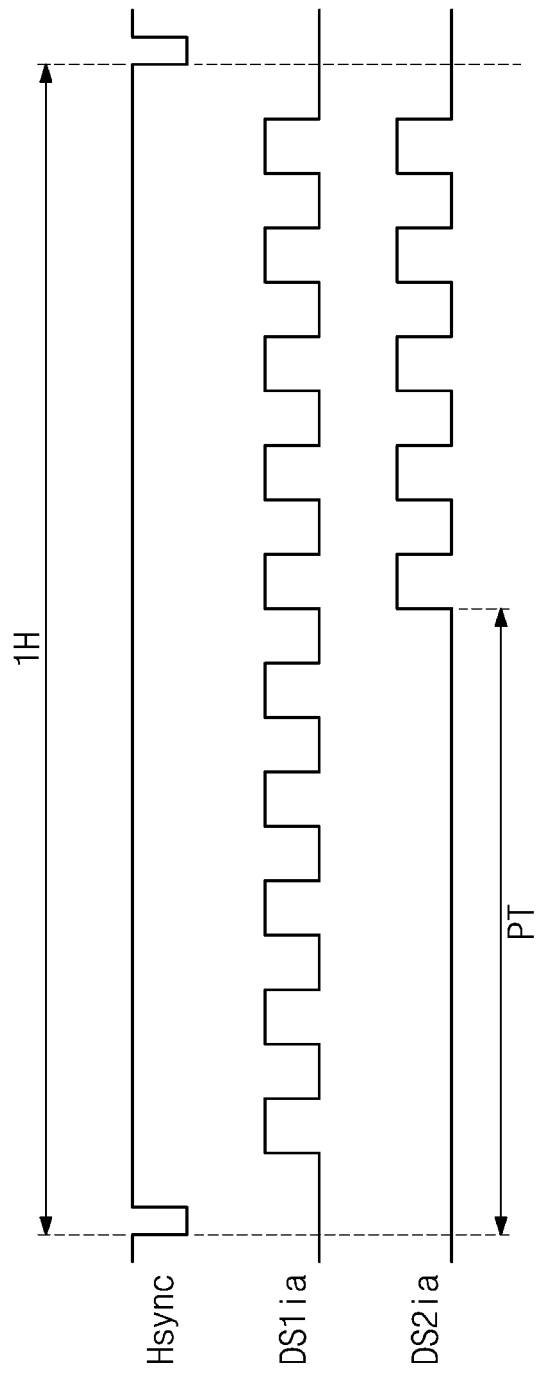
FIG. 11A illustrates timing diagrams of signals according to an embodiment of the present inventive concept.
Figure 11B:
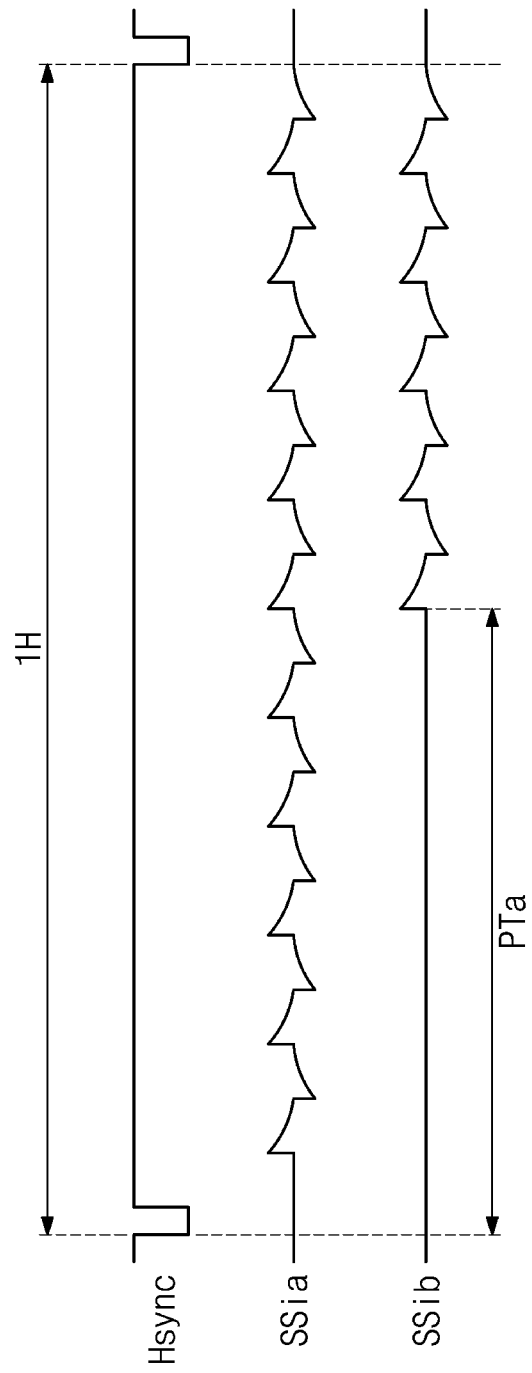
FIG. 11B illustrates timing diagrams of signals according to an embodiment of the present inventive concept.

FIG. 11A illustrates timing diagrams of signals according to an embodiment of the present inventive concept. FIG. 11B illustrates timing diagrams of signals according to an embodiment of the present inventive concept.

FIG. 11A depicts, by way of example, a waveform of the horizontal synchronizing signal Hsync, of a first transmission signal DS1*ia* provided to one electrode 210 in the first sensing mode, and of a second transmission signal DS2*ia* provided to the one electrode 210 in the second sensing mode. FIG. 11B depicts, by way of example, a waveform of the horizontal synchronizing signal Hsync, of a first sensing signal SSia obtained from one cross electrode 220 in the first sensing mode, and of a second sensing signal SSib obtained from the one cross electrode 220 in the second sensing mode.

Referring to FIG. 11A, the number of pulses included in the first transmission signal DS1*ia* during a first horizontal period 1H may be greater than that of pulses included in the second transmission signal SD2*ia* during the first horizontal period 1H. FIG. 11A depicts by way of example that the first transmission signal DS1*ia* includes ten pulses during the first horizontal period 1H, and that second transmission signal DS2*ia* includes ten pulses, but the present inventive concept is not particularly limited thereto.

The first transmission signal DS1*ia* may be synchronized with the display driver (see 100C of FIG. 5) and output to one electrode (210 of FIG. 7A), or may be output to one electrode (see 210 of FIG. 7A) in a state where the first transmission signal DS1*ia* is not relevant to operation of the display driver (see 100C of FIG. 5) or is not synchronized with the display driver (see 100C of FIG. 5).

The second transmission signal DS2*ia* may be synchronized with the display driver (see 100C of FIG. 5) and output to one electrode (see 210 of FIG. 7A). For example, the first horizontal period 1H may be provided with the second transmission signal DS2*ia* on its latter half in which noise is relatively small. For example, a noise signal may most greatly occur when a grayscale voltage is output to the data lines (see DL1 to DLm of FIG. 5). Therefore, the sensor driver (see 200C of FIG. 7A) may output the second transmission signal DS2*ia* to an interval that is synchronized with the display driver (see 100C of FIG. 5) and is less influenced with respect to the noise signal. For example, the sensor driver (see 200C of FIG. 7A) may output the second transmission signal DS2*ia* to one electrode (see 210 of FIG. 7A) after a first time PT from a point at which begins a variation in level of the horizontal synchronizing signal Hsync.

Referring to FIG. 11B, the number of pulses included in the first sensing signal SSia during a first horizontal period 1H may be greater than that of pulses included in the second sensing signal SSib during the first horizontal period 1H. The number of pulses included in the first sensing signal SSia may correspond to that of pulses included in the first transmission signal DS1*ia*, and the number of pulses in the second sensing signal SSib may correspond to that of pulses included in the second transmission signal DS2*ia*.

In the first sensing mode, the sensor driver (see 200C of FIG. 7A) may be synchronized or asynchronized with the display driver (see 100C of FIG. 5) and may receive the first sensing signal SSia. In the second sensing mode, the sensor driver (see 200C of FIG. 7A) may be synchronized with the display driver (see 100C of FIG. 5) and may receive the second sensing signal SSib. For example, in the second sensing mode, the sensor driver (see 200C of FIG. 7A) may receive the second sensing signal SSib in an interval that is less influenced with respect to the noise signal. For example, the sensor driver (see 200C of FIG. 7A) may receive the second sensing signal SSib after a second time PTa from a point at which begins a variation in level of the horizontal synchronizing signal Hsync. Therefore, it may be possible to reduce non-uniformity of sensitivity resulting from noise caused by the display layer (see 100 of FIG. 5) and as a result to improve sensitivity of proximity sensing.

Figure 12:
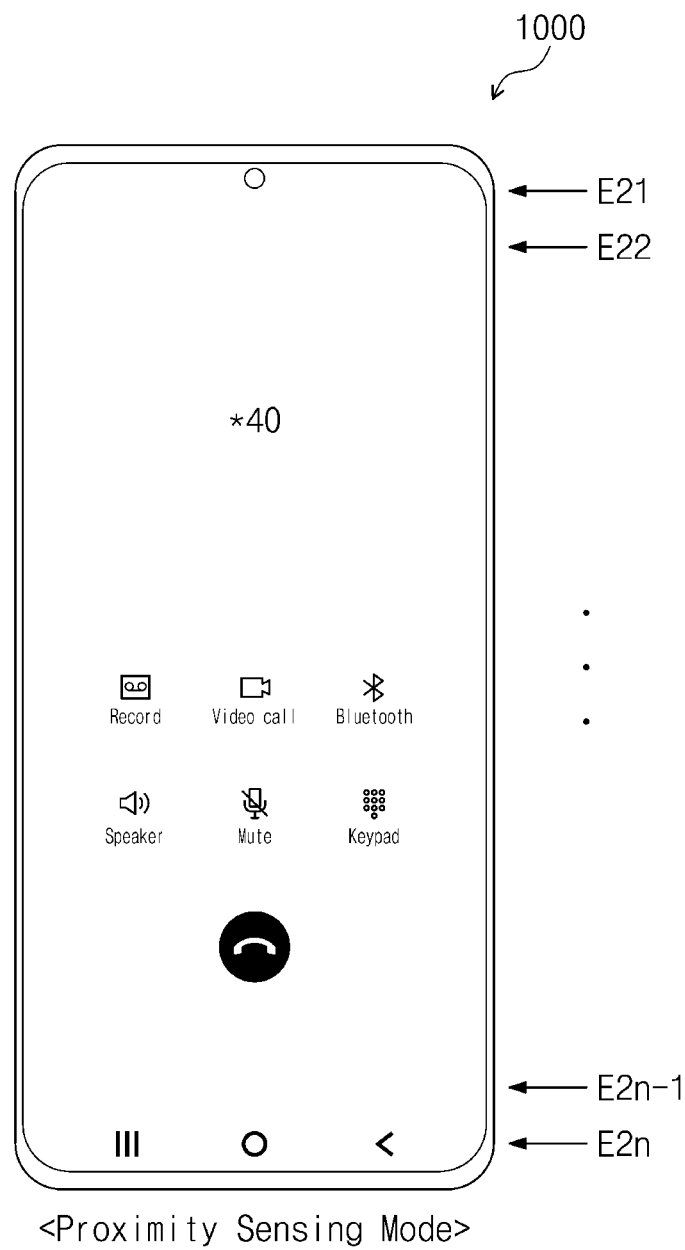
FIG. 12 illustrates a plan view showing an electronic device according to an embodiment of the present inventive concept.

FIG. 12 illustrates a plan view showing an electronic device according to an embodiment of the present inventive concept.

Referring to FIGS. 5 and 12, when the electronic device 1000 enters a voice call mode, the electronic device 1000 may operate in the proximity sensing mode. For example, the display layer 100 may be driven in the second display mode, and the sensor layer (see 200 of FIG. 7A) may be driven in the second sensing mode.

When the display layer 100 is driven in the second display mode, the display driver 100C may correspondingly provide the emission control lines EL1 to ELn with second emission control signals E21 to E2*n*. The second emission control signals E21 to E2*n* may correspond to one of the second emission control signals E2*i*, E2*ia*, E2*ib*, and E2*ic* discussed in FIGS. 9A, 9B, 10A, and 10B.

Figure 13:
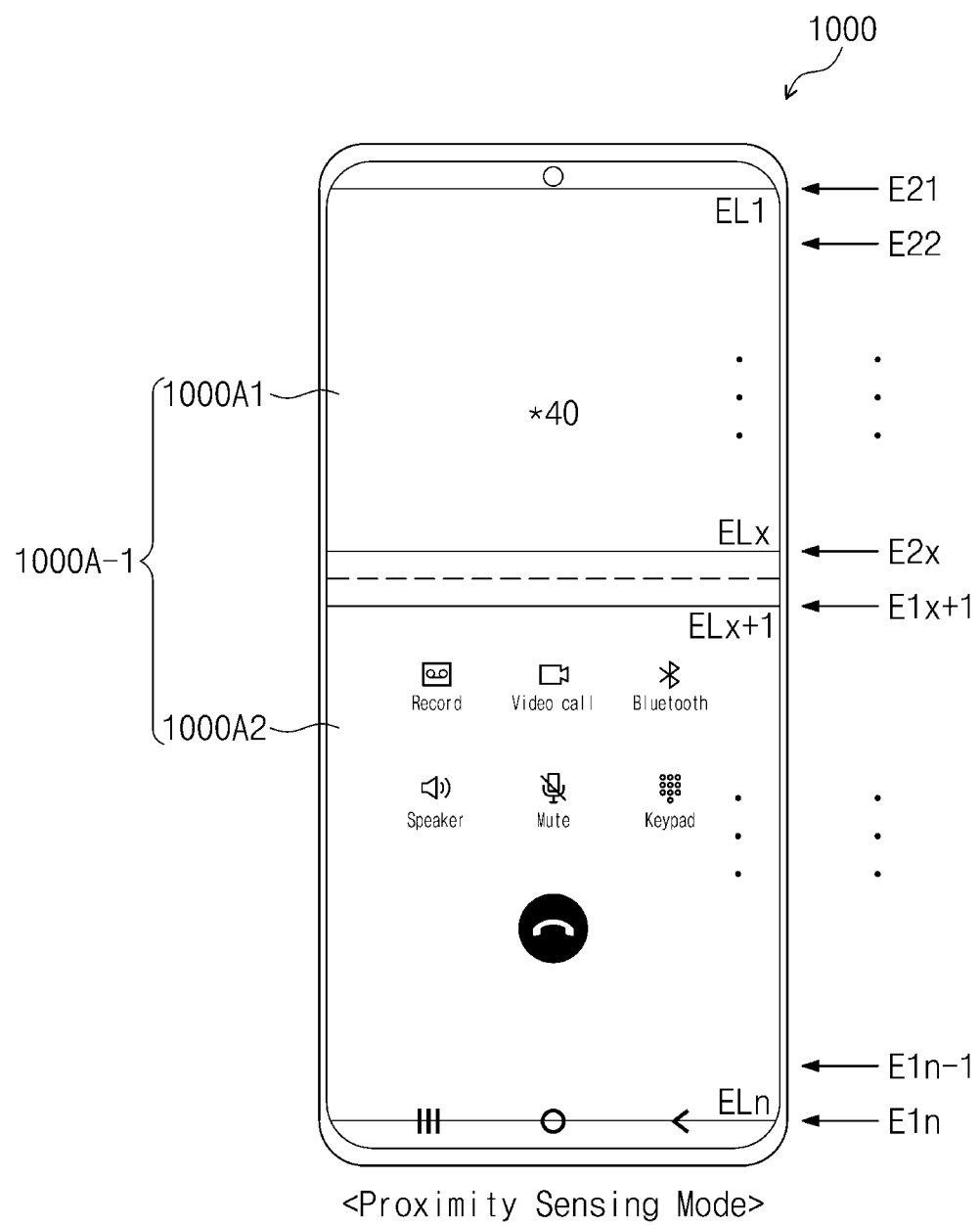
FIG. 13 illustrates a plan view showing an electronic device according to an embodiment of the present inventive concept.

FIG. 13 illustrates a plan view showing an electronic device according to an embodiment of the present inventive concept.

Referring to FIGS. 5 and 13, the display layer 100 may include a display region 1000A-1 that displays an image, and the display region 1000A-1 may include a first display region 1000A1 and a second display region 1000A2 adjacent to the first display region 1000A1.

The emission control lines EL1 to ELn may include first emission control lines EL1 to ELx located on the first display region 1000A1 and second emission control lines ELx+1 to ELn located on the second display region 1000A2.

When the electronic device 1000 enters a voice call mode, the electronic device 1000 may operate in the proximity sensing mode. The sensor layer (see 200 of FIG. 7A) may operate in the second sensing mode. In this case, the first display region 1000A1 may operate in the second display mode, and the second display region 1000A2 may operate in the first display mode. For example, the display driver 100C may output second emission control signals E21 to E2*x* to the first emission control lines EL1 to ELx, and may also output first emission control signals E1*x*+1 to E1*n* to the second emission control lines ELx+1 to ELn.

When the sensor layer (see 200 of FIG. 7A) operates in the first sensing mode, all of the first display region 1000A1 and the second display region 1000A2 may operate in the first display mode. In this case, the display driver 100C may output first emission control signals E11 to E1*n* to the first emission control lines EL1 to ELx and to the second emission control lines ELx+1 to ELn.

The first display region 1000A1 and the second display region 1000A2 may have their areas and positions that are fixedly provided or customized. For example, the area and position of the first display region 1000A1 may be determined considering size or shape of a user's ear.

Figure 14:
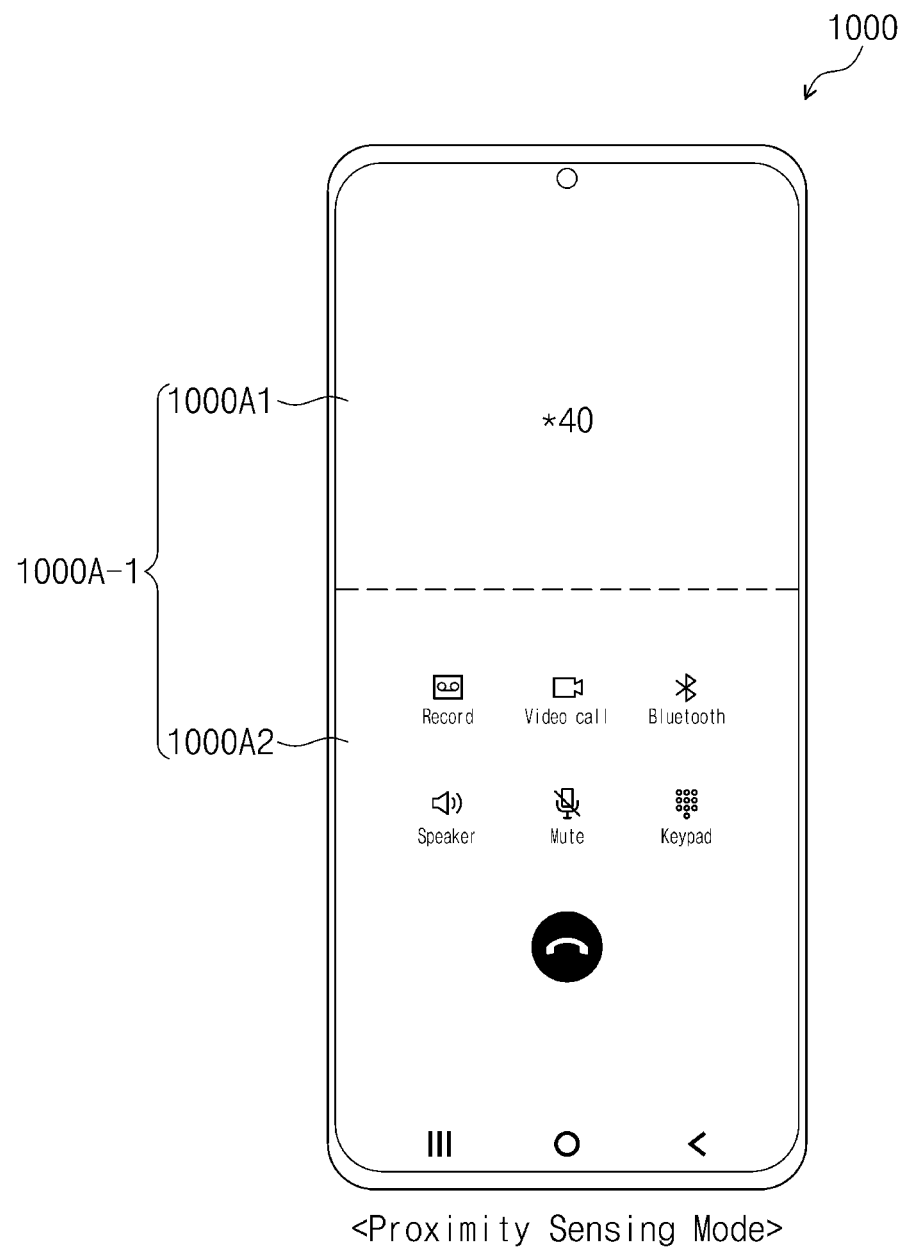
FIG. 14 illustrates a plan view showing an electronic device according to an embodiment of the present inventive concept.

FIG. 14 illustrates a plan view showing an electronic device according to an embodiment of the present inventive concept.

Referring to FIGS. 5 and 14, the display layer 100 may include a display region 1000A-1 that displays an image, and the display region 1000A-1 may include a first display region 1000A1 and a second display region 1000A2 adjacent to the first display region 1000A1.

When the electronic device 1000 enters a voice call mode, the electronic device 1000 may operate in the proximity sensing mode. In this case, brightness of the first display region 1000A1 may become less than originally intended brightness. For example, when the originally intended brightness is defined as 100%, the first display region 1000A1 may have brightness that is reduced to about 95% in the proximity sensing mode. In this case, it may be possible to decrease noise induced from the display layer 100, which noise is included in a signal obtained in the sensor layer (see 200 of FIG. 2) in the proximity sensing mode. Accordingly, the sensor layer (see 200 of FIG. 2) may improve proximity sensing capability.

According to the mentioned above, when a sensor layer operates a proximity sensing mode, a main driver may control a display driver to adjust a waveform of an emission control signal provided to a display layer. The waveform adjustment of the emission control signal may reduce noise of a signal obtained in the sensor layer in the proximity sensing mode, which may result in an improvement in proximity sensing capability.

While the present inventive concept has been described with reference to embodiments thereof, it will be readily apparent to those of ordinary skill in the art that various changes and modifications may be made without departing from the spirit and scope of the appended claims.

What is claimed is:

1. An electronic device, comprising:
   a display layer comprising a scan line, a data line, an emission control line, and a pixel;
   a display driver configured to drive the display layer and provide corresponding signals to the scan line, the data line, and the emission control line;
   a sensor layer on the display layer, the sensor layer operating in a first sensing mode driven at a first sensing frequency or in a second sensing mode driven at a second sensing frequency different from the first sensing frequency; and
   a sensor driver configured to drive the sensor layer,
   wherein when the sensor layer operates in the first sensing mode, the display driver outputs a first emission control signal to the emission control line and the sensor driver outputs a first transmission signal to the sensor layer,
   wherein when the sensor layer operates in the second sensing mode, the display driver outputs a second emission control signal to the emission control line and the sensor driver outputs a second transmission signal to the sensor layer, the second emission control signal having a second waveform different from a first waveform of the first emission control signal, and wherein each of the first transmission signal and the second transmission signal has an amplitude greater than zero.

2. The electronic device of claim 1, wherein
the second sensing frequency is less than the first sensing frequency, and
the second sensing mode is a proximity sensing mode that detects an object spaced apart from a surface of the electronic device.

3. The electronic device of claim 1, wherein a length of an interval in which the first emission control signal is activated is less than a length of an interval in which the second emission control signal is activated.

4. The electronic device of claim 3, wherein the pixel includes:
a pixel circuit electrically connected to the scan line, the data line, and the emission control line; and
a light emitting element electrically connected to the pixel circuit,
wherein a first driving current that flows through the light emitting element when the first emission control signal is provided is greater than a second driving current that flows through the light emitting element when the second emission control signal is provided.

5. The electronic device of claim 3, wherein during one frame interval in which an image is displayed on the display layer, the number of a plurality of first activation intervals in which the first emission control signal is activated is greater than the number of a plurality of second activation intervals in which the second emission control signal is activated.

6. The electronic device of claim 5, wherein a length of each of the first activation intervals is less than a length of each of the second activation intervals.

7. The electronic device of claim 1, wherein a length of an interval in which the first emission control signal is activated is greater than a length of an interval in which the second emission control signal is activated.

8. The electronic device of claim 7, wherein the pixel includes:
a pixel circuit electrically connected to the scan line, the data line, and the emission control line; and
a light emitting element electrically connected to the pixel circuit,
wherein a first driving current that flows through the light emitting element when the first emission control signal is provided is less than a second driving current that flows through the light emitting element when the second emission control signal is provided.

9. The electronic device of claim 7, wherein during one frame interval in which an image is displayed on the display layer, the number of a plurality of first activation intervals in which the first emission control signal is activated is the same as the number of a plurality of second activation intervals in which the second emission control signal is activated.

10. The electronic device of claim 7, wherein during one frame interval in which an image is displayed on the display layer, lengths of a plurality of first activation intervals in which the first emission control signal is activated are the same as each other.

11. The electronic device of claim 7, wherein during one frame interval in which an image is displayed on the display layer, a plurality of second activation intervals in which the second emission control signal is activated include a first sub-activation interval and a second sub-activation interval that has a length less than a length of the first sub-activation interval.

12. The electronic device of claim 11, wherein
the sensor driver receives sensing signals from the sensor layer,
the sensor driver samples and converts the sensing signals into digital data, and
the sensor driver applies weights to ones of the sensing signals and coverts the ones of the sensing signals into digital data, the ones of the sensing signals being sensed in an interval that includes the second sub-activation interval.

13. The electronic device of claim 11, wherein
the sensor driver receives sensing signals from the sensor layer,
the sensor driver samples and converts the sensing signals into digital data, and
the number of times of sampling sensing signals sensed in an interval that includes the second sub-activation interval is greater than the number of times of sampling sensing signals sensed in an interval that includes the first sub-activation interval.

14. The electronic device of claim 1, wherein
the display layer includes a first display region and a second display region adjacent to the first display region,
the emission control line includes a first emission control line on the first display region and a second emission control line on the second display region,
when the sensor layer operates in the first sensing mode, the display driver outputs the first emission control signal to the first emission control line and outputs an $(x+1)^{th}$ first emission control signal to the second emission control line, and
when the sensor layer operates in the second sensing mode, the display driver outputs the second emission control signal to the first emission control line and outputs an $(x+1)^{th}$ first emission control signal to the second emission control line.

15. An electronic device, comprising:
a display layer comprising a scan line, a data line, an emission control line, and a pixel;
a display driver configured to drive the display layer and provide corresponding signals to the scan line, the data line, and the emission control line;
a sensor layer disposed on the display layer and detecting an external input; and
a sensor driver configured to drive the sensor layer,
wherein when the sensor layer enters a proximity sensing mode from a touch sensing mode, the display driver generates a second emission control signal obtained by changing a waveform of a first emission control signal that is output to the emission control line and outputs the second emission control signal to the emission control line.

16. The electronic device of claim 15, wherein
in the touch sensing mode, the sensor layer is driven at a first sensing frequency, and
in the proximity sensing mode, the sensor layer is driven at a second sensing frequency less than the first sensing frequency.

17. The electronic device of claim 15, wherein
during one frame interval in which an image is displayed on the display layer, the number of a plurality of first activation intervals in which the first emission control signal is activated is greater than the number of a plurality of second activation intervals in which the second emission control signal is activated, and a length of each of the first activation intervals is less than a length of each of the second activation intervals.

18. The electronic device of claim 15, wherein during one frame interval in which an image is displayed on the display layer, the number of a plurality of first activation intervals in which the first emission control signal is activated is the same as the number of a plurality of second activation intervals in which the second emission control signal is activated, during one frame interval in which an image is displayed on the display layer, lengths of the plurality of first activation intervals in which the first emission control signal is activated are the same as each other, and during one frame interval in which an image is displayed on the display layer, the plurality of second activation intervals in which the second emission control signal is activated include a first sub-activation interval and a second sub-activation interval that has a length less than a length of the first sub-activation interval.

19. The electronic device of claim 15, wherein the pixel includes:

a pixel circuit electrically connected to the scan line, the data line, and the emission control line; and a light emitting element electrically connected to the pixel circuit, wherein a first driving current that flows through the light emitting element when the first emission control signal is provided is different from a second driving current that flows through the light emitting element when the second emission control signal is provided.

20. The electronic device of claim 15, wherein the display layer includes a first display region and a second display region adjacent to the first display region, the emission control line includes a first emission control line on the first display region and a second emission control line on the second display region, when the sensor layer operates in the touch sensing mode, the display driver outputs the first emission control signal to the first emission control line and outputs an $(x+1)^{th}$ first emission control signal to the second emission control line, and when the sensor layer operates in the proximity sensing mode, the display driver outputs the second emission control signal to the first emission control line and outputs an $(x+1)^{th}$ first emission control signal or an $(x+1)^{th}$ second emission control signal to the second emission control line.

* * * * *